US009905760B2

(12) United States Patent
Chen et al.

(10) Patent No.: US 9,905,760 B2
(45) Date of Patent: Feb. 27, 2018

(54) NON-VOLATILE RESISTANCE-SWITCHING THIN FILM DEVICES

(71) Applicant: The Trustees of the University of Pennsylvania, Philadelphia, PA (US)

(72) Inventors: I-Wei Chen, Swarthmore, PA (US); Xiang Yang, Philadelphia, PA (US)

(73) Assignee: The Trustees of the University of Pennsylvania, Philadelphia, PA (US)

( * ) Notice: Subject to any disclaimer, the term of this patent is extended or adjusted under 35 U.S.C. 154(b) by 0 days.

(21) Appl. No.: 15/181,761

(22) Filed: Jun. 14, 2016

(65) Prior Publication Data
US 2016/0293840 A1    Oct. 6, 2016

Related U.S. Application Data

(63) Continuation of application No. 14/506,177, filed on Oct. 3, 2014, now Pat. No. 9,425,393, which is a
(Continued)

(51) Int. Cl.
*H01L 47/00*        (2006.01)
*H01L 45/00*        (2006.01)
(Continued)

(52) U.S. Cl.
CPC ........ *H01L 45/145* (2013.01); *G11C 13/0007* (2013.01); *H01L 27/24* (2013.01); *H01L 45/085* (2013.01); *H01L 45/1253* (2013.01); *H01L 45/1266* (2013.01); *H01L 45/1625* (2013.01); *G11C 11/5685* (2013.01);
(Continued)

(58) Field of Classification Search
CPC ............ G11C 11/5685; G11C 13/0007; G11C 2213/15; G11C 2213/34; G11C 13/0002; G11C 13/0009; H01L 45/085; H01L 45/1266; H01L 45/145
USPC ....... 257/4, 314, 379, 530, E21.52, E27.071, 257/E27.103
See application file for complete search history.

(56) References Cited

U.S. PATENT DOCUMENTS 3,886,577 A    5/1975  Buckley
3,905,435 A    9/1975  Coronado
(Continued)

FOREIGN PATENT DOCUMENTS

WO    WO 2013/151675 A1    10/2013

OTHER PUBLICATIONS

Polymer Morphology; http://plc.cwru.edu/tutorial/enhanced/files/polymers/orient/orient.htm; accessed Dec. 28, 2012; 3 pages.

*Primary Examiner* — David Chen
(74) *Attorney, Agent, or Firm* — Baker & Hostetler LLP

(57) ABSTRACT

Disclosed herein are resistive switching devices having, e.g., an amorphous layer comprised of an insulating aluminum-based or silicon-based material and a conducting material. The amorphous layer may be disposed between two or more electrodes and be capable of switching between at least two resistance states. Circuits and memory devices including resistive switching devices are also disclosed, and a composition of matter involving an insulating aluminum-based or an silicon-based material and a conducting material. Also disclosed herein are methods for switching the resistance of an amorphous material.

7 Claims, 25 Drawing Sheets

Related U.S. Application Data continuation-in-part of application No. 13/060,514, filed as application No. PCT/US2009/068518 on Dec. 17, 2009, now Pat. No. 9,236,118, application No. 15/181,761, filed on Jun. 14, 2016, which is a continuation of application No. PCT/US2013/030178, filed on Mar. 11, 2013.

(60) Provisional application No. 61/139,028, filed on Dec. 19, 2008, provisional application No. 61/620,290, filed on Apr. 4, 2012, provisional application No. 61/715,902, filed on Oct. 19, 2012.

(51) Int. Cl.
*H01L 27/24* (2006.01)
*G11C 13/00* (2006.01)
*G11C 11/56* (2006.01)

(52) U.S. Cl.
CPC ...... *G11C 13/0002* (2013.01); *G11C 13/0009* (2013.01); *G11C 2213/15* (2013.01); *G11C 2213/33* (2013.01); *G11C 2213/34* (2013.01)

(56) References Cited

U.S. PATENT DOCUMENTS

| | | |
|---|---|---|
| 3,975,755 A | 8/1976 | Thornburg |
| 4,296,406 A | 10/1981 | Pearson |
| 5,045,643 A | 9/1991 | Miyabayashi |
| 6,990,008 B2 | 1/2006 | Bednorz et al. |
| 7,269,040 B2 | 9/2007 | Hu |
| 8,399,881 B2 | 3/2013 | Yukawa et al. |
| 9,236,118 B2 | 1/2016 | Chen et al. |
| 2003/0162399 A1 | 8/2003 | Singh |
| 2005/0202204 A1 | 9/2005 | Nishihara et al. |
| 2005/0285497 A1 | 12/2005 | Tamura |
| 2006/0081911 A1 | 4/2006 | Batra et al. |
| 2006/0189084 A1 | 8/2006 | Mizuguchi et al. |
| 2006/0220551 A1 | 10/2006 | Yamazaki |
| 2007/0120124 A1 | 5/2007 | Chen et al. |
| 2007/0269683 A1 | 11/2007 | Chen |
| 2008/0192534 A1* | 8/2008 | Lung ............... G11C 11/5678 365/163 |
| 2008/0224229 A1 | 9/2008 | Tajima et al. |
| 2008/0315206 A1 | 12/2008 | Herner et al. |
| 2009/0173930 A1* | 7/2009 | Yasuda ............... G11C 13/02 257/4 |
| 2010/0037942 A1 | 2/2010 | Borland et al. |
| 2010/0149872 A1 | 6/2010 | Aoyagi |
| 2011/0156128 A1 | 6/2011 | Ono |
| 2011/0210405 A1 | 9/2011 | Nakagawa |
| 2011/0266512 A1 | 11/2011 | Chen et al. |
| 2012/0021612 A1 | 1/2012 | Nakagawa |
| 2012/0043518 A1 | 2/2012 | Cheng et al. |
| 2014/0175357 A1 | 6/2014 | Nardi |

* cited by examiner

FIG. 3
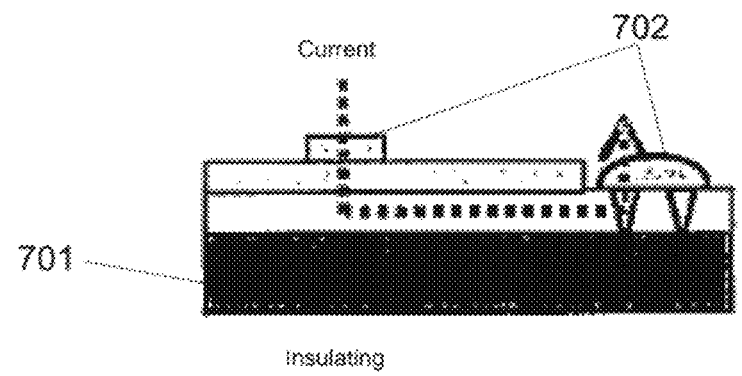
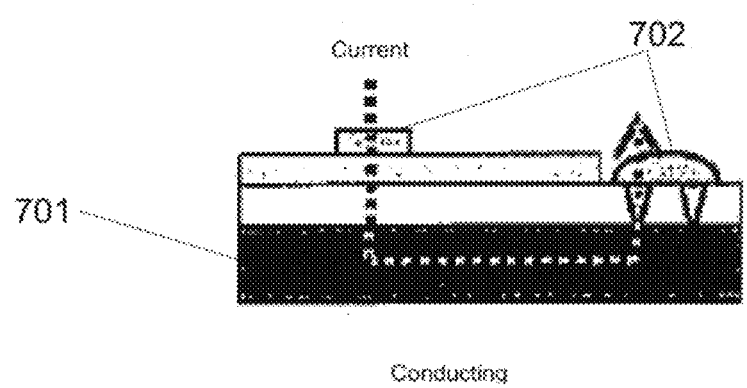

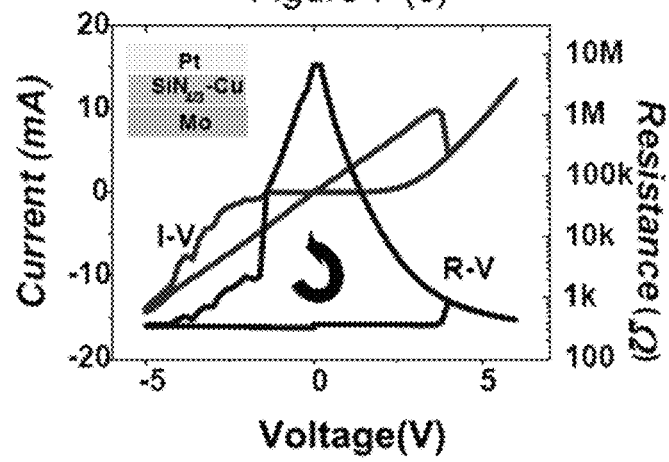
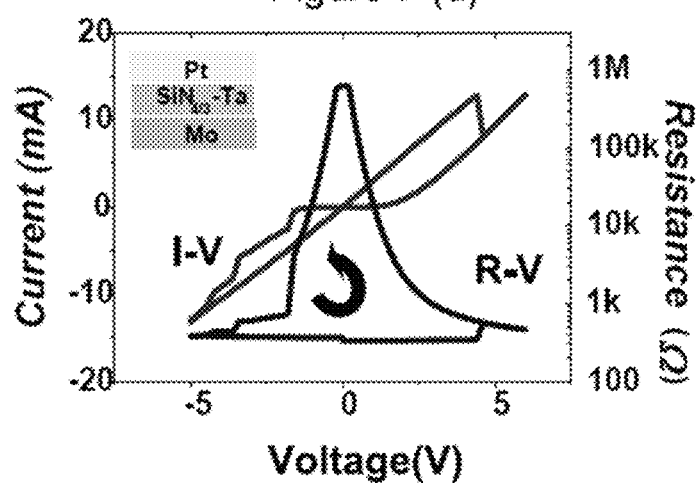

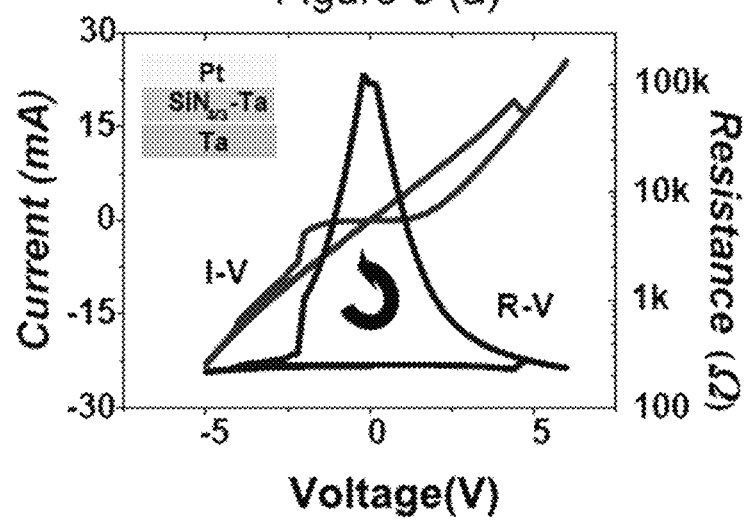
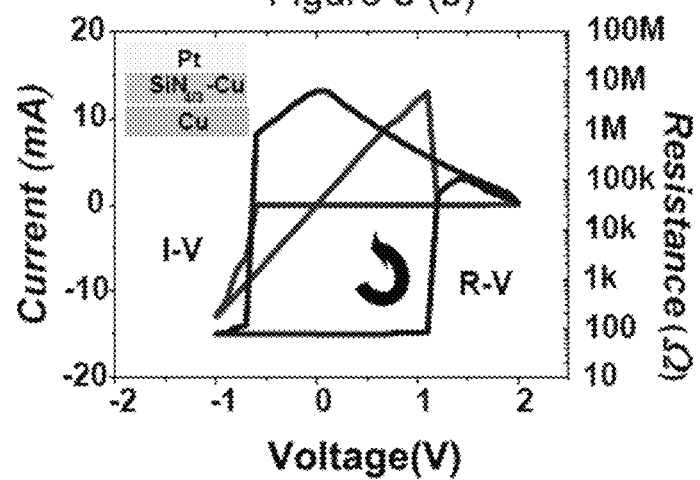

NON-VOLATILE RESISTANCE-SWITCHING THIN FILM DEVICES

RELATED APPLICATIONS

The present application is a continuation of now-allowed U.S. application Ser. No. 14/506,177 (filed Oct. 3, 2014), which is a continuation in part of U.S. application Ser. No. 13/060,514 (filed Jul. 8, 2011 and issued as U.S. Pat. No. 9,236,118), which United States application claims priority to PCT application no. PCT/US2009/068518 (filed Dec. 17, 2009), which PCT application claims priority to U.S. application No. 61/139,028 (filed Dec. 19, 2008); the present application is also a continuation of PCT application no. PCT/US2013/030178 (filed Mar. 11, 2013), which PCT application claims priority to U.S. application No. 61/620,290 (filed Apr. 4, 2012) and also to U.S. application No. 61/715,902 (filed Oct. 19, 2012). The entireties of all of the foregoing applications are incorporated herein by reference for any and all purposes.

STATEMENT OF GOVERNMENT INTEREST

This invention was made with government support under Grant No. DMR-11-04530 awarded by the National Science Foundation. The government has certain rights in the invention.

BACKGROUND

Resistance-switching behavior is well known in the art and has been observed and studied in some metal-insulator mixtures since the mid 1970's. Reversible resistance-switching devices are currently one of the main contenders for replacing flash memory devices in future non-volatile memory applications. Such future non-volatile memory devices need to be increasingly scalable (to length scales lower than about 22 nanometer ("nm")), at low energy operation and fabrication cost, and exhibit complementary metal-oxide-semiconductor ("CMOS") process compatibility.

Some resistance-switching technologies may be triggered by voltage, a phenomenon called Electrical Pulse Induced Resistance ("EPIR") switching effect. EPIR semiconductor devices are disclosed in U.S. Pat. No. 3,886,577 (Buckley). In the Buckley devices, a sufficiently high first voltage (50V) is generally applied to a semiconductor thin film in which an approximately 10 micron portion, or filament, of the film is set to a low resistivity state. The device is then typically reset to a high resistance state by the action of a second high voltage pulse. However, the number of switching cycles performed strongly affects set voltage. Thus, these devices generally exhibit high power consumption and poor cycle fatigue performance.

Other efforts in the art have investigated ferroelectric and magnetoresistive materials for non-volatile memory applications. These materials, however, tend to suffer from cycle fatigue and retention problems. Moreover, many magnetoresistive oxide devices require magnetic switching fields and require low operating temperatures.

Application of an electrical stimulus in a magnetic field to some perovskite family thin films shows useful resistive switching properties. Early efforts with perovskite materials required relatively high voltages and the EPIR effect tends to be cycle dependant. Later advances in these materials were able to create two terminal devices with two stable states with lower power consumption. However, the devices made from perovskite materials are largely incompatible with the semiconductor industry due to their crystal structures and the difficulties in manufacturing these materials on silicon substrates.

Metal oxides and other perovskite like materials have also been proposed for resistive switching memory devices. These metal oxide devices, however, suffer from incompatibility with silicon based semiconductor industry, and may also suffer from a lack of scalability.

Further, many of the aforementioned techniques and devices have not shown scalability for future devices, such as those expected to be in the 22 nm range for the year 2016.

SUMMARY

There is a need for CMOS compatible nanoscale non-volatile resistance-switching devices that exhibit low power consumption and can be manufactured at low temperature using currently available silicon based semiconductor industry techniques. Moreover, aluminum-based and silicon-based compositions are widely used in CMOS devices, indicating a particular need for aluminum-based and silicon-based nanoscale non-volatile resistance-switching devices. In addition, there is also a need for passive devices including resistors and conductors using these same CMOS compatible compositions.

In an effort to fill the needs above, in an embodiment, resistive devices comprise at least one amorphous layer comprising a composition of an electrically conducting composition and an electrically insulating aluminum-containing or silicon-containing composition. The electrically conducting composition of the amorphous layer comprises from about 1% to 40% by molar percentage of the amorphous layer and at least two electrodes in contact with the amorphous layer.

In another embodiment, circuits comprise a plurality of resistive devices, each of which comprises at least one amorphous layer, the amorphous layer comprising a composition of an electrically conducting composition and an electrically insulating aluminum-containing or silicon-containing composition. The electrically conducting composition of the amorphous layer comprises from about 1% to 40% by molar percentage of the amorphous layer and at least two electrodes in contact with the amorphous layer.

In another embodiment, compositions of matter comprise an amorphous composition of an electrically conducting composition and an electrically insulating aluminum-containing or silicon-containing composition. The electrically conducting composition of the amorphous layer comprises from about 1% to 40% by molar percentage of the amorphous layer and at least two electrodes in electrical contact with the amorphous layer. The electrically conducting composition can comprise one or more of Pt, Pd, Ni, W, Au, Ag, Cu, Al, Rh, Re, Ir, Os, Ru, Nb, Ti, Zr, Hf, V, Ta, Cr, Mo, Mn, Tc Fe, Co, Zn, Ga, In, Cd, Hg, Tl, Sn, Pb, Sb, Bi, Be, Mg, Ca, Sr, Ba, Li, Na, K, Rb, Cs, a conducting metal (Me) nitride, $MeN_x$, a conducting metal (Me) silicide, $MeSi_x$, or any combination thereof, wherein x is in the range of from about 0.5 to about 3.

In an embodiment, memory devices comprise at least one amorphous layer, the amorphous layer comprising a composition of an electrically conducting composition, and an electrically insulating aluminum-containing or silicon-containing composition. The electrically conducting composition of the amorphous layer comprises from about 1% to about 40% by molar percentage of the amorphous layer, and at least two electrodes in electrical contact with the amorphous layer.

In another embodiment, methods for switching a resistive device comprise providing at least one amorphous layer, the amorphous layer comprising a composition of an electrically conducting composition, and an electrically insulating aluminum-containing or silicon-containing composition. The electrically conducting composition of the amorphous layer comprises from about 1% to about 40% by molar percentage of the amorphous layer, and at least two electrodes in electrical contact with the amorphous layer, and providing a set voltage or current to the amorphous layer.

Aluminum-containing and silicon-containing non-volatile resistive switching devices present a class of materials capable of operation as stable, non-volatile resistance switches in the nanoscale range that may be used in various non-volatile memory applications such as a switch or a logic device. The general structure of the device is a layered thin film set between at least two electrodes and capable of switching between two resistance states, one state having a relatively larger resistance compared to a second state.

In an embodiment, an electrically conducting electrode may be deposited on a silicon substrate. A thin film of an insulating aluminum-containing or silicon-containing material and a conducting material can be co-deposited on the electrode to create an amorphous resistance-switching layer, such that the conducting constituent is lower than the (bulk) percolation limit. The concentration of the conducting layer should be sufficiently high, however, such that below certain thicknesses, the film is conducting along the thickness direction due to the existence of short conducting paths. A second electrode is deposited on top of the substrate to create a two terminal resistance-switching device. These electrodes may deliver a current or voltage to the amorphous resistance-switching layer.

As one example of the embodiments above, electrodes may deliver a voltage, which may be known as the set voltage to the amorphous resistance-switching layer, which switches the device from a first resistance state to a second resistance state. The device may stay in the second resistance state until the application of a negative set voltage, which switches the device from the second resistance state back to the first resistance state. The device may stay in the first resistance state until another application of the set voltage.

As another example of the embodiments above, the electrodes may also deliver a voltage to the device, which voltage's absolute value is smaller than the absolute value of the set voltages. This smaller voltage may be used to read the resistance state of the amorphous resistance-switching layer without altering the resistance state of the device. This voltage may be known as the read voltage.

In one embodiment of the above, resistive switching may be non-volatile and thus may not require the continuous application of either voltage or current to maintain resistance states. In addition, the device may be capable of switching between a low and high resistance state repeatedly without a loss of switching time or stability.

The present disclosure provides, inter alia, methods for fabricating incorporating a metal in a minute amount into a film that includes an insulating material. Dielectrics, including high dielectric constant (high-K) ones, such as $HfO_x$, are useful in such applications because these materials may prevent current leakage. The present disclosure provides the use of amorphous dielectrics (e.g., high K dielectrics) for non-volatile resistance memory applications.

This disclosure describes how insulating amorphous thin films used as non-volatile memory after addition of conducting compositions. Further information is found in, e.g., U.S. application Ser. No. 13/060,514, "Non-Volatile Resistance-Switching Thin Film Devices (filed Jul. 8, 2011), which application is incorporated herein by reference in its entirety for all purposes. The present disclosure presents the utility of a variety of amorphous insulators, e.g., (a) yttrium oxide, hafnium oxide and tantalum oxide, which cover transition metal oxides and rare earth oxides, and (b) magnesium oxide, aluminum oxide and aluminum nitride, which cover main group II and main group III metal oxides and nitrides. These include a broad range of commonly used dielectrics that are compatible with a broad range of conducting (such as metallic) compositions.

In one aspect, the present disclosure provides resistive devices that comprise at least one amorphous resistance-switching layers that comprises (a) an electrically insulating composition; and (b) an electrically conducting composition, wherein from about 1 percent to about 40 percent by molar percentage of the amorphous resistance-switching layer comprises the electrically conducting composition; and at least two electrodes capable of electrical contact with the amorphous resistance-switching layer.

The present disclosure also provides memory devices that include a resistive switching device according to the present disclosure.

Also provided are methods comprising disposing, on a substrate, at least one or more amorphous resistance-switching layers according to the present disclosure.

BRIEF DESCRIPTION OF THE DRAWINGS

The summary, as well as the following detailed description, is further understood when read in conjunction with the appended drawings. For the purpose of illustrating the invention, there are shown in the drawings exemplary embodiments of the invention; however, the invention is not limited to the specific methods, compositions, and devices disclosed. In addition, the drawings are not necessarily drawn to scale. In the drawings:

FIG. 3 depicts a change in a conducting path of one embodiment of the present disclosure when the substrate evolves from a state of high resistance-switching to a state of low resistance-switching.

DETAILED DESCRIPTION OF ILLUSTRATIVE EMBODIMENTS

Figure 1:
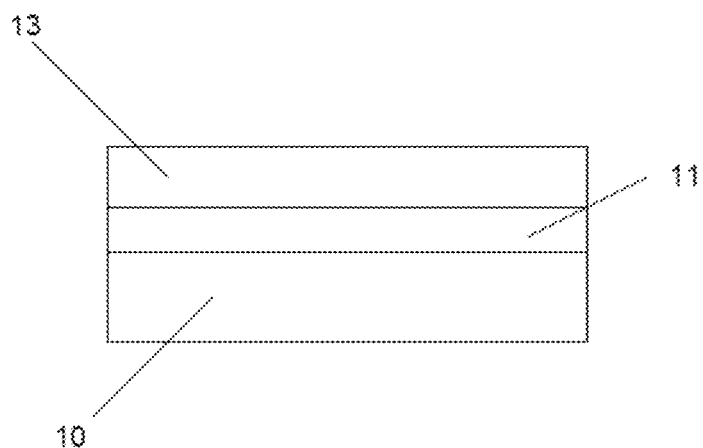
FIG. 1 depicts an embodiment of a resistive switching device according to certain embodiments of the present disclosure.

Resistive switching may comprise a composition of matter, a device, a circuit, a system, or any combination thereof capable of switching a resistance state (hereinafter generally referred to interchangeably as "resistance-switching" and "resistance-switching device"). As an example, resistive switching devices may comprise means for resistance-switching. An electrically insulating aluminum-containing or silicon-containing layer and a conducting layer may be configured as an amorphous layer, which may be capable of resistance-switching.

In an embodiment, resistance-switching may comprise switching from a first state of resistance to a second state of resistance. As another example, resistance-switching may comprise switching from a first state in a set of states to a second state in a set of states. The set of states may comprise a plurality of states and resistance-switching may be configured to apply one or more of a set voltage, set current, read voltage and/or read current to the resistance switched device. As an additional example, resistance-switching may comprise any number of states and switching between the any number of states. As one example the resistance of a composition may be governed by the equation V=IR, where V and I may be determined voltages and currents respectively and R may be the resistance of the device.

In an embodiment, a set voltage or current may comprise a voltage or current that when applied to a resistive switching device causes a resistance-switching device to switch from a first resistive state to a second resistive state. Resistance-switching devices may comprise one or more set voltages and/or set currents. As such, a resistance-switching device may be put into any number of states by any number of set voltages. In addition, resistance-switching devices may comprise means for a set voltage and/or means for a set current. Resistance-switching may also comprise a means for applying a set voltage or a set current.

In an embodiment, a read voltage or current may comprise a voltage or current that when applied to a resistive switching device does not cause a change in the resistive state of the device; however, it may be configured to determine the resistive switching state, which, as noted above may be a first state, a second state, or any state in a set of states. Resistance-switching devices may be read by any number of read voltages and/or currents. As such, the embodiments described herein may comprise means for applying a set voltage or current.

In an embodiment, resistance-switching may comprise one or more electrodes. Electrodes may comprise one or more conducting materials electrically contacted with the resistance-switching material. In an embodiment, electrodes may be comprised of a conducting material, a semiconducting material, or any combination thereof. As used in electrodes, conducting materials include all noble metals, all transition metals, all main group metals, all rare earth metals, all conduction transition metal nitrides and carbides, all conducting metal silicides, all p-type or n-type doped silicon and other semiconductors, all conducting oxides including those that are transparent to visible light, all organic conducting materials, any other conducting materials and any combinations thereof. As a non-limiting set of examples, electrodes may comprise one or more of Pt, Pd, Ni, W, Au, Ag, Cu, Al, Rh, Re, Ir, Os, Ru, Nb, Ti, Zr, Hf, V, Ta, Cr, Mo, Mn, Tc, Fe, Co, Zn, Ga, In, Cd, Hg, Tl, Sn, Pb, Sb, Bi, Be, Mg, Ca, Sr, Ba, Li, Na, K, Rb, Cs. Nitrides $MeN_x$ include TiN, ZrN, HfN, NbN or TaN. Silicide$_s$ $MeSi_x$ include $PtSi_2$, $TiSi_2$, $CoSi_2$, $NiSi_2$, $NbSi_2$, $TaSi_2$, $MoSi_2$ or $WSi_2$, and x is in the range of from about 0.5 to about 3, and/or any combination thereof. As one example, a resistance-switching device may comprise a plurality of electrodes, which may be capable of or configured to apply a read voltage, a read current, a set voltage and/or a set current to a resistance-switching device.

In an embodiment, an "amorphous resistance-switching layer" comprises one or more amorphous layers of insulating aluminum containing material and electrically conducting material; the electrically conducting composition comprising from about 1 percent to about 40 percent by molar percentage of the material or from about 1.5 percent to about 35 percent by molar percentage of the material, or from about 2 percent to about 30 percent by molar percentage of the material, or even from about 3 percent to about 25 percent by molar percentage of the material and, in electrical contact with the amorphous layer, at least two electrodes, the one or more amorphous layers adding to a combined thickness of between about 1 nm and about 60 nm, or from about 2 nm to about 50 nm, or from about 3 nm to about 45 nm, or from about 4 nm to about 35 nm or even from about 5 nm to about 30 nm as measured between one or more pairs of electrodes. The amorphous layer is capable of switching between at least two resistive states, a first resistive state having a resistance greater than at least one second resistance state. As such, in an embodiment, a resistance-switching device comprises means for resistance-switching.

In an embodiment, molar percentage comprises a percentage calculated by multiplying (% M+% Me)/(% Al+% M+% Me) by 100, wherein a metal is denoted as M, a metal nitride is denoted as $(Me)N_x$, wherein Me is a nominally metallic element such as, but not limited to, Ti in TiN, a silicide is denoted as $(Me)Si_x$, where Me is again a nominally metallic element such as, but not limited to, Co in $CoSi_2$. Aluminum is denoted as Al, wherein an aluminum containing electrically insulating material may be an aluminum oxide, $AlO_{1.5}$, an aluminum nitride, AlN, or an aluminum oxy-nitride, denoted as $AlO_wN_z$, wherein $2w+3z=3$, such as, but not limited to, $AlON_{1/3}$ and $AlO_{1/2}N_{2/3}$ As used herein, "% a" refers to percent a, and a can be M, Me, Al. As used in $(Me)N_x$, $(Me)Si_y$, and $AlO_wN_z$, x is in the range of from about 0.5 to about 3, y is in the range of about 0.5 to about 3, w is in the range of from about 0 to about 1.5, and z is in the range of from about 0 to about 1.

FIG. 1 illustrates an example geometry of a layered two terminal resistance-switching device, wherein an amorphous resistance-switching layer 11 is deposited between two electrodes 10, 13. The amorphous layer 11 may be switched between two different resistance states. These resistance states are set by applying a current or voltage via the electrodes 10 and 13. The current or voltage used for setting the resistance state may be the "set current" or "set voltage" of the device. The resistance of the amorphous layer is read by the application of a current or voltage that is lower than the set current or voltage. This lower current or voltage may be a "read current" or a "read voltage". The read current or read voltage may not affect the resistance state of the device, but may be configured to determine the present resistive state of the switching device. As another example, the resistive switching device may comprise means for applying a set voltage and/or a set current to a resistive switching layer. In addition, the resistive switching device may comprise means for applying a read voltage and/or a read current to the amorphous layer.

Figure 2:
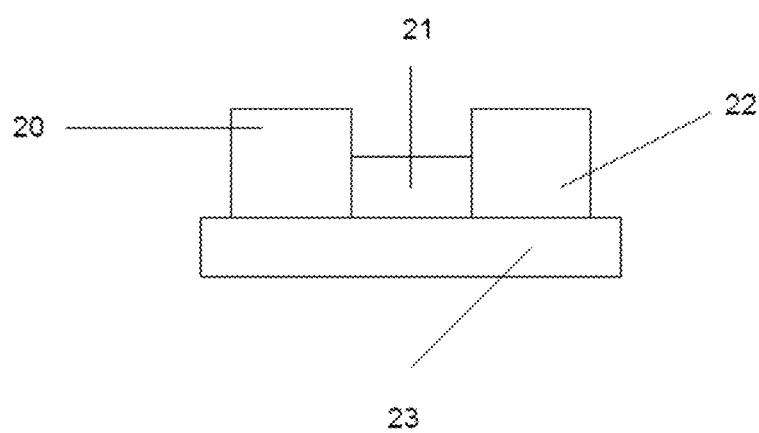
FIG. 2 depicts an embodiment of a resistive switching device according to certain embodiments of the present disclosure.

FIG. 2 illustrates another possible geometry of a two terminal resistance-switching device, wherein an amorphous resistance-switching layer 21 is deposited on a silicon substrate 23 between two electrodes 20, 22 that are also deposited on the substrate 23. The amorphous layer 21 may be switched between two different resistance states. These resistance states may be set by applying a set current or voltage via the electrodes 20 and 22. The resistance of the amorphous layer is read by the application of a read current or voltage via electrodes 20 and 22, where the absolute value of the read current is lower than the set current or voltage. The read current or voltage may not affect the resistance state of the device. The geometries depicted in FIGS. 1 and 2 do not limit the possible geometries for these devices but merely provide useful examples of possible geometries.

The geometry of the switching layer as used herein may be a rectangle, square, ribbon, tube, rod, cylinder, hemisphere, dot, sphere, trapezoid or any other shape compatible with the one or more layers set between at least one pair of electrodes. The geometry of the electrodes includes any shape that is compatible with electrically contacting the resistance-switching layer. These electrodes may be circular, rectangular, cylindrical, square, straight, curved, hemispheric or any other suitable geometry.

FIG. 3 depicts an embodiment of an amorphous resistance-switching device where the conduction path between two electrodes 702 changes. The layer 701 may evolve from a state of high resistance-switching to a state of low resistance-switching causing a change in the conduction path of the device.

In an embodiment, an amorphous layer comprised of one or more conductive materials and insulating aluminum-containing or silicon-containing materials is described herein. A certain embodiment of the present invention utilizes co-sputtering techniques to obtain the amorphous layer of an insulating aluminum-containing or silicon-containing material and one or more conducting materials. Other suitable techniques for preparing amorphous layers include, without limitation, direct-current sputtering, radio-frequency sputtering, pulsed laser deposition, physical vapor deposition, atomic layer deposition, chemical vapor deposition, ion-assisted deposition, wet chemistry, co-evaporation techniques and any other method, present or future for constructing an amorphous resistance-switching layer. The conducting composition may also be deposited into an amorphous layer by ion implantation or any other method of introduction.

Figure 4:
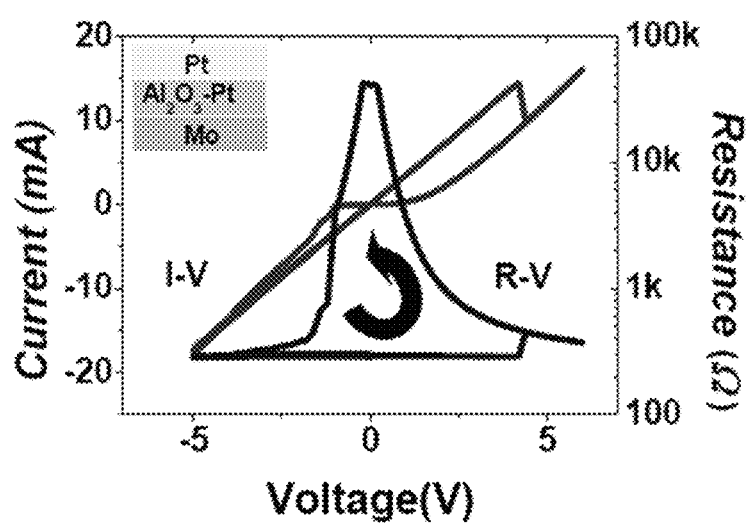
FIG. 4 shows the typical I-V and R-V curves of one embodiment of the present invention using an amorphous $AlO_{3/2}$—Pt, with the combination of Mo and Pt electrodes.

FIG. 4 depicts the typical I-V and R-V curves of one embodiment of the present invention using an amorphous $AlO_{3/2}$—Pt, with the combination of Mo and Pt electrodes. A typical room temperature I-V curve is shown in FIG. 4 for a voltage sweep of 0 V to −5 V to 0 V to 5 V to 0 V to −5 V to 0 V. The mixture shows a low initial resistance ~300Ω and this low resistance state is stable under a negative bias. Under a positive bias, it is still stable below 4.5 V, but the resistance suddenly increases to a larger value around approximately 400Ω when the bias exceeded 4.5 V. The high resistance state is kept until a negative bias of from about −1 to −1.5 V is applied, which switches the resistance back to the low resistance state.

Figure 5:
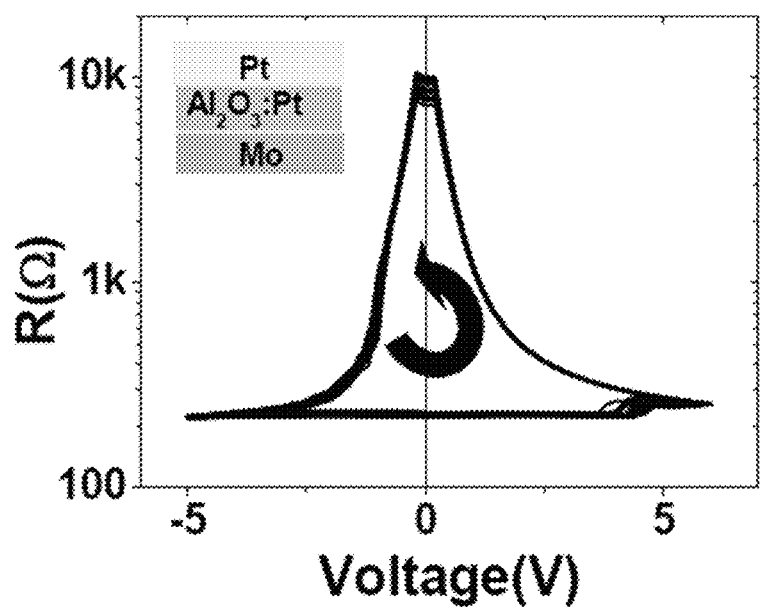
FIG. 5 depicts 30 consecutive R-V curves of one embodiment of the present disclosure using $AlO_{3/2}$—Pt, with the combination of Mo and Pt electrodes.
Figure 6A:
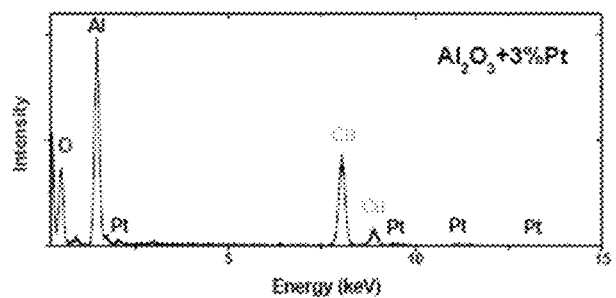
FIGS. 6(a)-(d) depicts the energy dispersive X-ray spectroscopy (XPS) of $AlO_{3/2}$, and various concentrations of Pt for $AlO_{3/2}$—Pt.
Figure 6B:
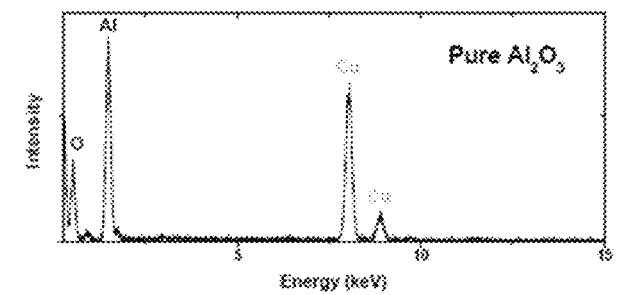
Figure 6C:
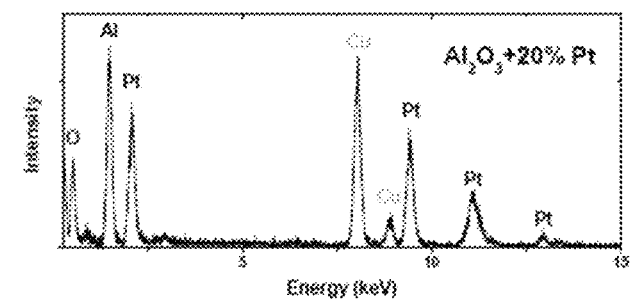
Figure 6D:
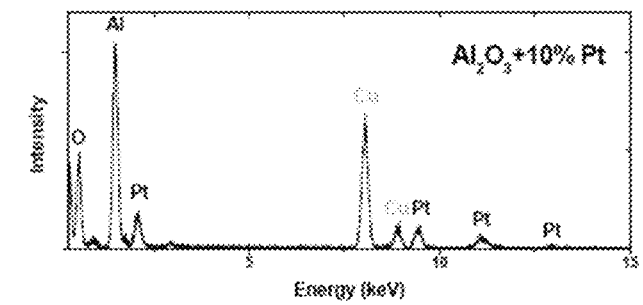
Figure 7:
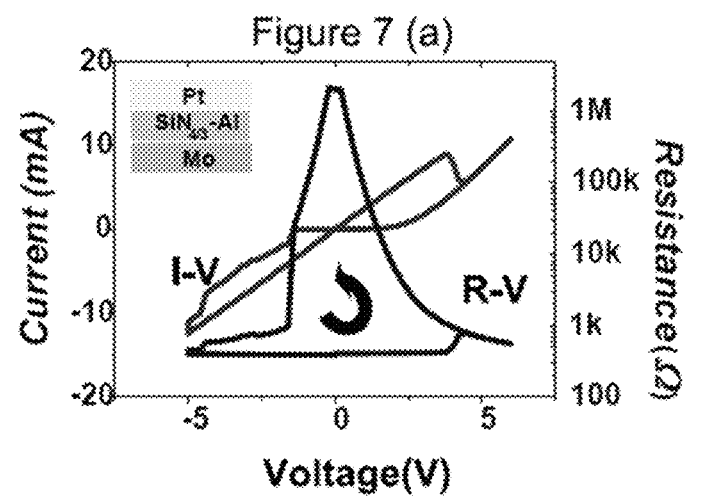
FIGS. 7(a)-(f) depict example I-V and R-V curves of one embodiment of the present disclosure using amorphous $SiN_{4/3}$-M, where M=Al, Cr, Cu, Ta, and Pt, and amorphous $SiO_xN_y$—Pt, with the combination of Mo and Pt electrodes.
Figure 7:
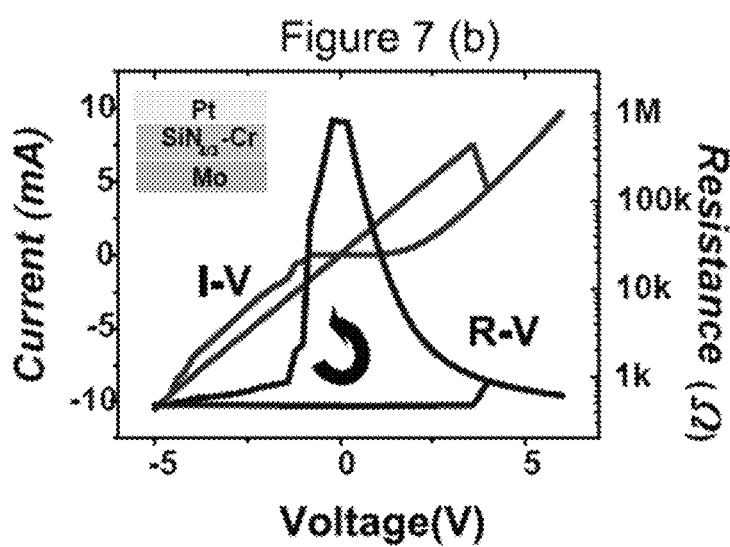
Figure 7:
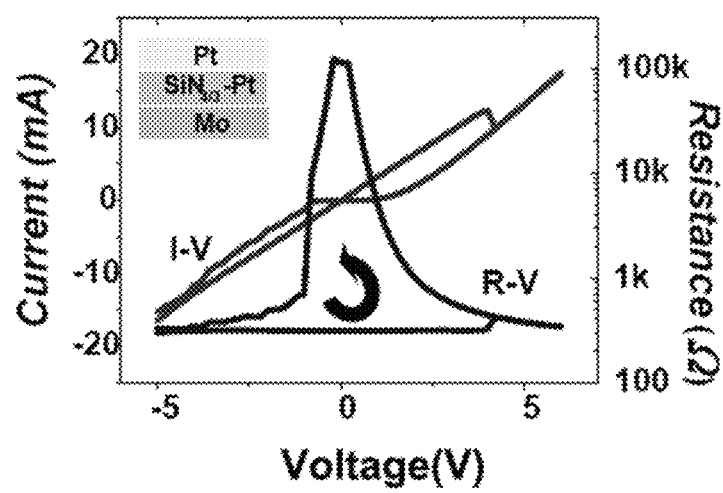
Figure 7:
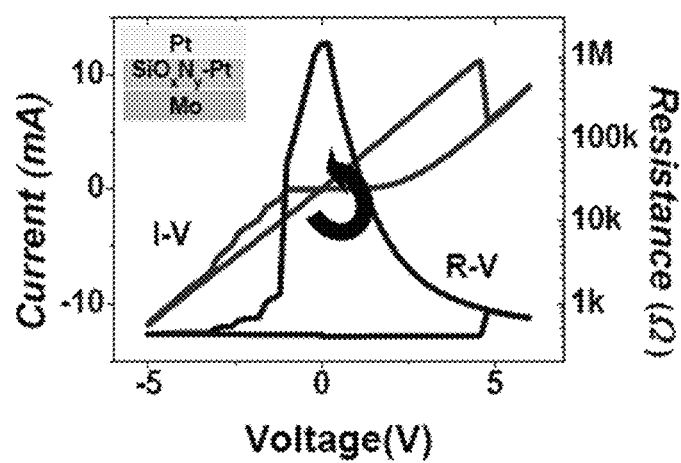

FIG. 5 depicts 30 consecutive R-V curves of one embodiment of the present disclosure using $AlO_{3/2}$—Pt, with the combination of Mo and Pt electrodes. As such, in an embodiment, aluminum-based resistance-switching devices may comprise repeatable resistance-switching behavior.

FIGS. 6(a)-(d) depicts the energy dispersive X-ray spectroscopy (XPS) of $AlO_{3/2}$, and various concentrations of Pt for $AlO_{3/2}$—Pt.

FIG. 7(a)-(f) depicts example I-V and R-V curves of another embodiment of the present invention using amorphous $SiN_{4/3}$-M, where M=Al, Cr, Cu, Ta, and Pt, and amorphous $SiO_xN_y$—Pt, with the combination of Mo and Pt electrodes.

FIG. 8(a)-(d) depicts an example of I-V and R-V curves of yet another embodiment of the present invention using other bottom electrodes, Ta, Cu and TiN, in combination with Pt top electrode.

Figure 9:
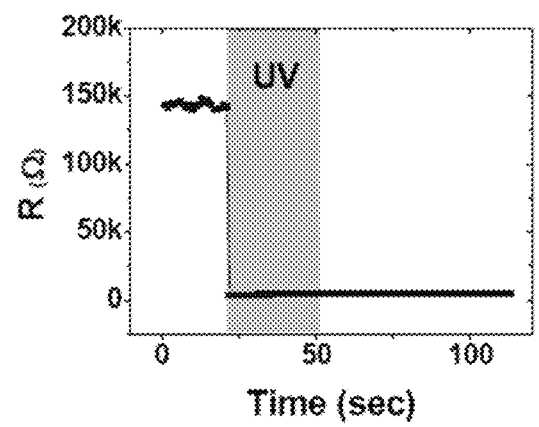
FIGS. 9(a)-(b) depict an example of a UV reset of the resistance state.
Figure 9:
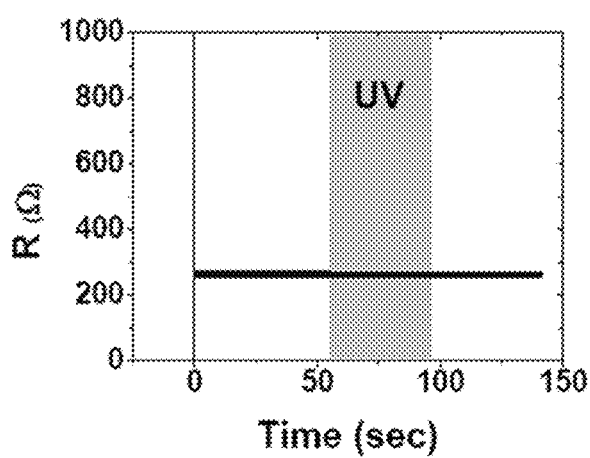

FIGS. 9(a)-(b) depicts UV resets the resistance state. Since UV can stimulate electron movement but may not stimulate ion or atom movement, FIG. 9 illustrates that electron movement may be the only requirement in the resistance switching device of the present disclosure. In general, switching speed requiring only electron movement may be faster.

Figure 10:
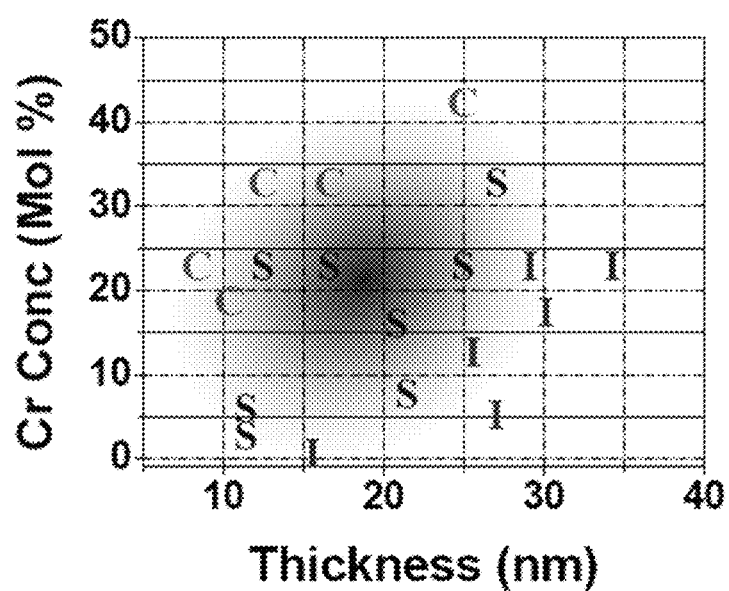
FIG. 10 depicts the thickness-Cr composition map of amorphous $SiN_{4/3}$—Cr layer, which may be a conductor (C), an insulator (I), or a switchable resistor (S).

FIG. 10 depicts the thickness-Cr composition map of amorphous $SiN_{4/3}$—Cr layer in an embodiment, which provides both a conductor and an insulator in addition to a switchable resistor using the same composition. Since only thickness adjustment is required, compositions of the present invention can provide resistive elements of vastly different electric properties.

Figure 11:
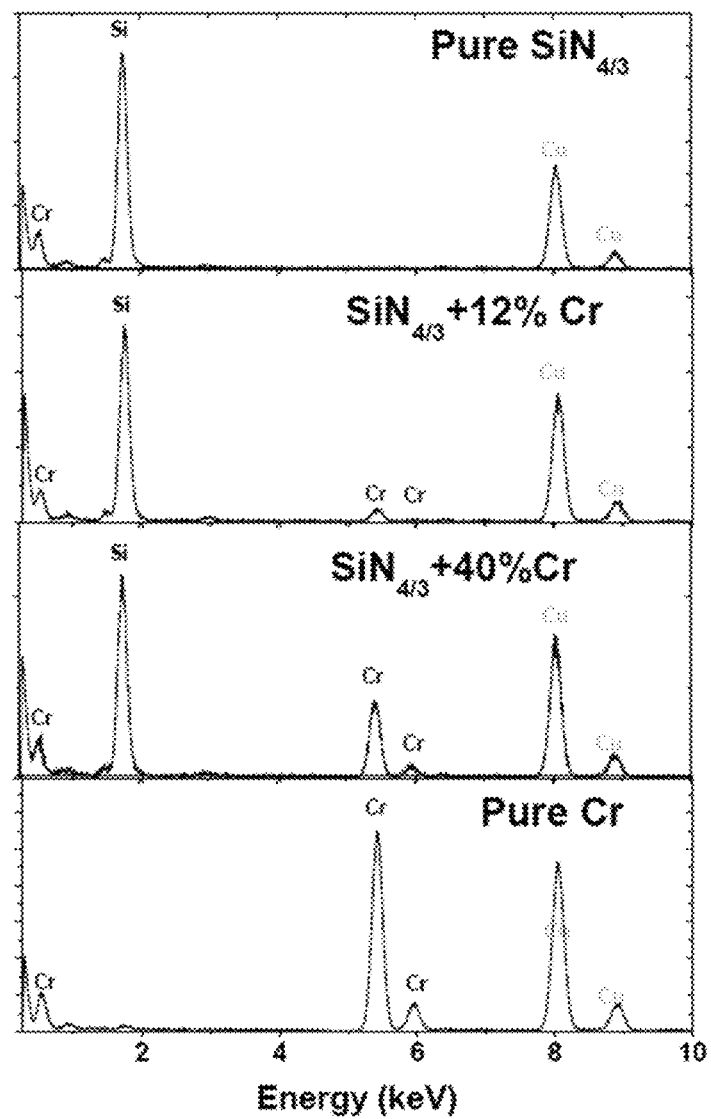
FIG. 11 depicts the energy dispersive X-ray spectroscopy (XPS) of $SiN_{4/3}$, and various concentrations of Cr for $SiN_{4/3}$—Cr.

FIG. 11 depicts the energy dispersive X-ray spectroscopy (XPS) of $SiN_{4/3}$, and various concentrations of Cr for $SiN_{4/3}$—Cr.

As in FIG. 1, certain embodiments of the present invention may have at least one pair of electrodes situated as a top and bottom electrode. Devices may also include a substrate, a first electrode layer disposed on the substrate, at least one amorphous resistance-switching layer as described herein disposed on the first electrode, and a second electrode layer disposed on the amorphous layer. The first and second electrode layers may respectively serve as bottom and top electrodes. In this regard, at least one of the electrodes may also comprise a conductive material.

These electrodes may be grown or deposited in any manner known in the art present or future capable of disposing electrodes on thin films. Resistance switches may also have at least one pair of electrodes configured in any other geometry suitable for electrically contacting the resistance-switching layer. It is desirable that the electrodes be selected based on the composition of the mixture layer. Without being bound by any particular theory of operation, the desired compositions of the mixture layers take into consideration the class of electrically insulating compositions (e.g., oxides, nitrides or oxynitrides), the class of electrically conducting compositions (e.g., metals, metal nitrides or metal silicides), the work function of the electrically conducting compositions, and the electron affinity of the electrically insulating compositions.

Suitable substrates may be any material that is compatible with the CMOS industry, such as silicon (Si). In other embodiments, the Si substrate may be doped as either an n-type or as a p-type Si. Other substrates such as sapphire, glass, ceramics and polymers may also be used.

Devices may be particularly suited for random access memory and other memory applications. For example, simple two terminal resistance-switching devices may be produced to read and write binary information. Thus, the application of a first set voltage would set the device to a first resistance state. The application of a second set voltage would set the device to a second resistance state. In this manner, information may be written to the device upon application of a voltage having the appropriate magnitude and polarity. The device may be read by applying a smaller read voltage to the device through the same electrodes. A resistance-switching memory device may be non-volatile in its operation.

Circuits having one or more resistance-switching devices are also included in a sample embodiment. Each resistance-switching device may have an amorphous layer as described above between two electrodes as described above. Circuits having resistance-switching devices may also include, for example other circuit elements such as resistive devices, capacitive devices, field effect transistor devices, or any other electronic elements known in the art. Such circuits may be used for any purpose known in the art.

Proposed Theoretical Switching Mechanism

Without being bound by any particular theory of operation of the disclosed devices, a tentative picture of the switching mechanism in the amorphous layer is herein described. Initially, in the as-fabricated state, some of the connected conducting paths due to the overlap of the electron wave functions of conductive material go through the film thickness and provide the metallic conduction. The energy levels of the conductive material are aligned around the Fermi level of the two electrodes with a narrow bandwidth (B), which is narrow because the overlap of wave function is weak and not extending to many atoms of the conductive composition. This is the low resistance state. When a high enough positive bias is applied, a few electrons are trapped at some sites.

Without being bound by any particular theory of operation, it is believed that to trap electrons in the conductive material sites, the electrons usually will need to overcome an energy barrier between the conducting paths and the trap sites. The size of this energy barrier depends on the energy level difference between the conduction band of the aluminum-containing or silicon-containing insulator and the conductive material. Thus, the switching voltage is dependent on the same barrier. In a device where a lower electrode has an energy barrier between the electrode and the aluminum-containing or silicon-containing insulator that is lower than the energy barrier between the top electrode and the aluminum-containing or silicon-containing insulator, the set voltage should be positive, referring to the bias that causes electrons flowing from bottom to top, or electrical current from top to bottom. This configuration favors trapping when the electrons flow from the electrode with a lower energy barrier. In practice, if the work function of the top electrode is higher than that of the bottom electrode, the set voltage is positive, switching the state of lower resistance to the state of higher resistance. Conversely, if the work function of the bottom electrode is higher than that of the top electrode, the set voltage is negative. The work function can depend on the electrode material and its state, which may be either crystalline or amorphous. It may also depend on the orientation of the electrode material when the material is crystalline. In addition, it may depend on the interface of the electrode material in contact with the amorphous layer. Therefore, it is possible to alter the sign of the set voltage by redesigning the electrodes and the interfaces.

The reset voltage should be lower than the set voltage because the trapped electron at the sites occupies a higher energy state due to localization, making it easier to tunnel back to the bottom electrode, requiring lower voltage. In this way, the isolated paths with trapped electrons appear to work like a floating gate that regulates the conduction on the remaining metallic paths. The trapped electrons are isolated from the electrodes by the insulating barrier which makes it difficult for them to leak out, thus providing the non-volatile character of the memory.

The trapped electrons are believed to raise the energy level of the site to the next available state. The trapping event also increases the energy of the nearby conductive material sites due to the electrostatic interaction energy, acting as an isolated floating gate that prevents the electron from passing through the nearby region. This spreads out the originally aligned energy levels of the conductive material sites to a characteristic distribution width (W). If the aligned energy level width W is larger than the bandwidth B, the electron wave at each site becomes localized as in the case of Anderson localization in amorphous solids.

In order to pass a current under these conditions, the electrons then need to hop from the localized state in one site to the localized state in another. The resistance of the mixture increases due to this variable range hopping. Under these conditions, the device is in a high resistance state.

Upon the application of a large enough negative bias, these trapped electrons hop from the trapping sites, lowering the energy level dispersion width W until it is less than the bandwidth B. Under this condition, the material regains its initial conductive property and returns to the low resistance state.

EXAMPLES

An example of a resistance-switching memory device is described using thermal oxide coated singe crystal n-type or p-type silicon with 100 or 111 orientations as the substrate, polycrystalline Mo as the bottom electrode, Pt as the top electrode and $Al_2O_3$—Pt as the amorphous mixture layer. The various materials listed above do not share a common structure, and indeed the electrodes and the amorphous mixture layers may be deposited on heated or unheated substrates. As one example, test cell may have a diameter of about 100 microns.

Further to the example above, the Pt top electrode may provide superior scratch resistance and may therefore be more convenient for electrical testing, however, other common electrodes may be used. Materials for common electrodes are referred to above in regard to common electrodes.

As an example, the bottom electrode of Mo was deposited by DC-sputtering. Film thickness, orientation and crystallinity were determined by a theta-2 theta diffractometer and a four circle x-ray diffractometer, both using a Cu K$\alpha$ source. The surface morphology was observed by atomic force microscopy. In the same example, RF sputtering was used to deposit an amorphous $Al_2O_3$—Pt layer and the top electrode of Pt, the electrode being deposited through a shadow ask. Electrical properties were measured several ways. The amorphous layer was verified using a theta-2-theta diffractometer. The presence of Pt in the amorphous layer was confirmed using energy dispersive X-ray spectroscopy. Examples of amorphous layers with different Pt compositions are shown in FIG. 6. To facilitate the measurement, the amorphous layers were deposited on carbon coated copper TEM grids. It should be understood by one having skill in the art that these lab methods are not intended to be limiting for any aspect of and/or determination and/or fabrication of the compositions and devices described herein.

The example heterostructure thin film devices showed excellent resistance-switching between an initial low-resistance and a set high resistance, as shown by the current-voltage (I-V) and the resistance-voltage (R-V) FIG. 4 The on-off ratio of the resistance in the test devices typically exceeds 100:1. The device was tested repeatedly and showed little change in memory of either high or low resistance, as evidenced by the 30 overlapping R-V loops shown in FIG. 5.

In testing the above device, current-voltage (I-V) and resistance-voltage (R-V) curves were measured in both continuous and pulsed voltage-sweep modes. As used in the above and the following tests, positive bias is the one causing a current to flow from the top electrode to the bottom electrode. A typical room temperature I-V and R-V curves of a device with an amorphous resistance-switching layer of $AlO_{3/2}$—Pt and Pt/Mo top/bottom electrodes as shown in FIG. 4 has a switching voltage of 4 V for low resistance to high resistance, and a switching voltage of −1 V for high resistance to low resistance. The I-V and R-V curves were recorded in the voltage-control mode and were the same for both continuous and the pulsed mode. The resistance defined as the ratio of V/I is plotted along with a schematic circle indicating the rotational direction of the R-V hysteresis. The mixture shows a low initial resistance 300Ω and this low resistance state is stable under a negative bias. Under a positive bias, it is still stable below 4 V, but the resistance suddenly increases to a larger value, 400Ω when the bias exceeded 4 V. The high resistance state is highly non-linear with a resistance value that decreases with voltage: at 0 V, the high resistance state has a resistance value of 40,000Ω in FIG. 4, which is 130 times that of the value of the low resistance state. The high resistance state is kept at zero voltage indicating the memory is non-volatile: this zero-voltage resistance is typically higher than 20 kilo ohm. The high resistance state is further kept until a negative bias of about −1.0 to −1.5 V is applied, which switches the resistance back to low resistance state. The device also allowed a read voltage between −0.5 V and +1 V without disturbing the high and low resistance states.

In the example above, switching was also determined using voltage pulses. The voltage pulse required to switch the device was measured using repeated pulses of a certain pulse width, with the magnitude of their pulse voltage systematically increased until switching was complete. After each pulse, the resistance was measured at a fixed low voltage of about 0.2 V to determine whether switching had occurred or not. The process was next repeated using pulses of different widths.

In the example above, the resistance states can be kept in a non-volatile manner as verified by certain retention experiments. The devices stored in air for several months experience no memory lapse. Generally, there is no need for an electrical source to maintain the resistance states.

As an example of silicon-containing composition, $SiN_{4/3}$-M (M=Al, Cr, Cu, Ta, Pt) and $SiO_xN_y$—Pt amorphous layer were deposited using RF sputtering. For electrode, Mo bottom electrode and Pt top electrode were deposited using DC sputtering. The fabricated switching devices have similar I-V and R-V curves as shown in FIG. 7a-f.

Figure 8:
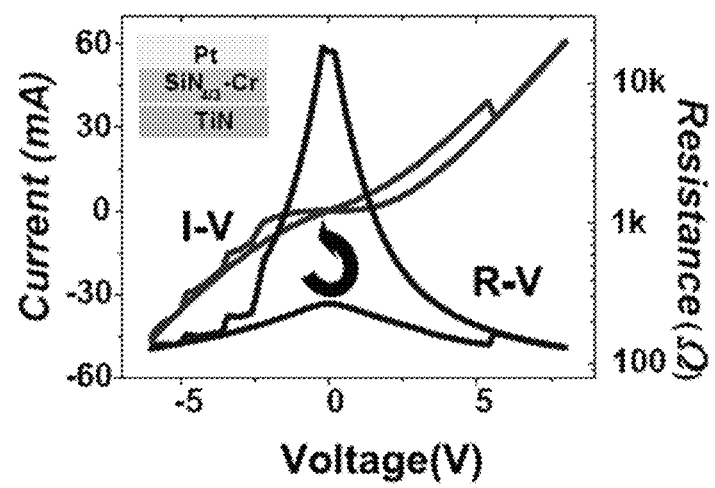
FIG. 8(a)-(d) depict example I-V and R-V curves with various bottom electrodes, Ta, Cu and TiN, in combination with Pt top electrode.
Figure 8:
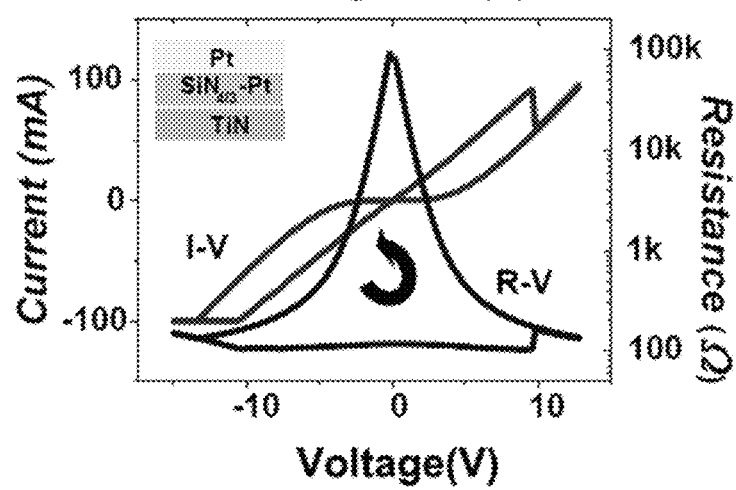

As an example of electrodes made of different metals and metal nitrides, bottom electrodes of Ta. Cu and TiN were used to fabricate amorphous silicon-based resistance-switching devices with similar I-V and R-V curves as shown in FIGS. 8a-d. FIG. 8a also illustrates that the conducting composition in the amorphous layer and the bottom electrode can be the same, both made of Ta. Likewise, FIG. 8d illustrates that they can be both Cu.

As shown in FIG. 9a, UV irradiating a resistance-switching device may cause the device to reset from high resistance state to low resistance state, but not to set (FIG. 9b). This device used a two-side-polished fused silica as substrate which is transparent to UV. Since UV irradiation generates only photoelectrons but no electric voltage, it only stimulates electron movement but not ion or atom movement. Therefore, this example illustrated that resistance-switching in the present device requires only electron movement but not ion or atom movement. Not requiring the slower movement of ions or atoms, such device has an intrinsically faster switching rate.

Such switchable devices were fabricated using a broad range of M composition and mixture layer thickness. One example is shown in FIG. 10 for devices made of amorphous $SiN_{4/3}$—Cr mixture layer in which S stands for switchable devices. In the figure, C stands for conducting device with always low resistance, I stands for insulating device with always high resistance. Both C and I devices do not show resistance-switching. This example also illustrated that the same composition can be used to provide a conductor, a switchable resistor, and an insulator by adjusting the thickness of the amorphous layer.

The composition shown in FIG. 10 was determined using energy dispersive X-ray spectroscopy of amorphous layers.

To facilitate the measurement, the amorphous layers were deposited on carbon coated copper TEM grids. Examples of amorphous layers with different Cr compositions are shown in FIG. 11.

The above examples illustrated that the amorphous insulating compositions may be based on aluminum-containing or silicon-containing oxides, nitrides and oxynitrides. They also illustrated that the electrodes may be made of a metal, e.g., Cu, or a metal nitride, e.g., TiN, and the conducting composition may be a transition metal, e.g., Cr, a main group metal, e.g., Al, and it can be made of the same composition as those of the electrodes. These examples are not meant to be limiting, and persons skilled in the art will understand that other compositions may be used to provide the switching device, the switching circuit, and the method to switch the resistance and to read the resistance states.

In one aspect, the present disclosure provides resistive devices. The disclosed devices suitably include at least one amorphous resistance-switching layers that comprises an electrically insulating composition; and an electrically conducting composition, wherein from about 1 percent to about 40 percent by molar percentage of the amorphous resistance-switching layer comprises the electrically conducting composition; and at least two electrodes capable of electrical contact with the amorphous resistance-switching layer.

In some embodiments, from about 0.5 percent to about 90 percent by molar percentage of the amorphous resistance-switching layer comprises the electrically conducting composition. Embodiments in which from about 1 percent to about 40 percent or about 50 percent by molar percentage of the amorphous layer comprises the electrically conducting composition are considered especially suitable.

The amorphous resistance-switching layer may suitably have a thickness in the range of from about 1 nm to about 60 nm, to about 100 nm, to about 200 nm, or even about 500 nm, as well as all intermediate ranges. The layer may be patterned into any shape that the user may desire, e.g., square, oval, rectangular, and the like.

It should be understood that the present disclosure includes embodiments in which a device includes one, two, three, four, or even more layers of amorphous material as described herein. In devices that feature multiple layers, there is no requirement that any two layers be identical to one another in terms of composition, shape, or characteristics. It should also be understood that a device may include two or more layers that are individually addressable. This may be accomplished by physically placing a layer into contact with an electrode (or physically disrupting electrical contact between a layer and an electrode. It may also be accomplished by addressing electrodes individually via a controller or other device.

Insulating compositions may include, e.g., an insulating oxide, an insulating nitride, an insulating oxynitride, or any combination thereof.

An insulating oxide suitably has the formula $AO_x$. X may have a value in the range from about 0.2 to about 4.50 or from about 0.4 to about 3.8. A may suitably have a valence in the range of from +1 to +7, +8, or even +9.

A (of $AO_x$) may be a metal. A non-exhaustive listing of suitable metals includes, e.g., Be, Mg, Ca, Sr, Ba, Sc, Y, Ti, Zr, Hf, V, Nb, Ta, Cr, Mo, W, Mn, Tc, Re, Fe, Ru, Os, Co, Rh, Ir, Ni, Pd, Pt, Cu, Ag, Au, Zn, Cd, B, Al, Ga, In, Si, Ge, Sn, Pb, La, Ce, Pr, Nd, Pm, Sm, Eu, Gd, Tb, Dy, Ho, Er, Tm, Yb, Lu, or any combination thereof.

An insulating nitride may have a formula of $AN_x$. X may suitably have a value between 0.9 to 1.5; A may have a valence of 3 to 4 in some embodiments. A may be, e.g., B, Al, Ga, In, C, Si, Ge, Sn, or any combination thereof.

An insulating oxynitride may have the formula $AO_xN_y$. A may be B, Al, Ga, In, C, Si, Ge, Sn, or any combination thereof. X may have a value in the range of about 1.3 to about 2.2; y may have a value of between about 0.9 and about 1.5.

The conducting composition suitably includes a metal. Exemplary metals include, e.g., Pt, Pd, Ni, Au, Ag, Cu, Zn, Cd, Hg, Al, Ga, In, Tl, Ge, Sn, Pb, Sb, Bi, Ir, Os, Re, W, Ta, Hf, La, Rh, Ru, Tc, Mo, Nb, Zr, Y, Co, Fe, Mn, Cr, V, Ti, Sc, Be, Mg, Ca, Sr, Ba, Li, Na, K, Rb, Cs or any combination thereof. The electrically conducting composition may also comprise a metal nitride. Suitable metal nitrides include, e.g., TiN, ZrN, HfN, NbN, TaN, or any combination thereof.

A conducting composition may also include a metal silicide. Suitable metal silicides include, e.g., $PtSi_2$, $TiSi_2$, $CoSi_2$, $NiSi_2$, $NbSi_2$, $TaSi_2$, $MoSi_2$, $WSi_2$, or any combination thereof.

An amorphous layer may suitably have a relative dielectric constant between about 1 and about 5000, or between about 10 and about 1000, or between about 50 and about 500, or even about 100.

Also provided are memory devices that include a resistive switching device according to the present disclosure. A memory device may include at least two stable resistance states. The resistance states may be adapted for multi-bit non-volatile data storage.

The present disclosure also provides methods. These methods include contacting an electrically insulating composition with an electrically conducting composition so as to form an admixture wherein from about, e.g., 1 percent to about 40 percent by molar percentage of the admixture comprises the electrically conducting composition. The admixture may be such that the resultant material is essentially (or entirely) single phase.

Also provided are methods, these methods including disposing, on a substrate, at least one or more amorphous resistance-switching layers according the present disclosure. The methods may also include placing at least one electrode into electrical communication with the at least one amorphous resistance-switching layer.

Exemplary Embodiments

An example of a resistance-switching memory device is described using thermal oxide coated single crystal n-type or p-type silicon with 100 or 111 orientations as the substrate, polycrystalline Mo as the bottom electrode, Pt as the top electrode, and 1-Pt (I stands for an insulator selected from the group of $HfO_2$, $YO_{3/2}$, MgO, $TaO_{5/2}$, AlN, $AlO_{3/2}$) as the amorphous mixture layer. Materials suitable for the disclosed devices need not share a common structure, other than being amorphous. Indeed, crystalline $HfO_2$, $Y_2O_3$, MgO, $Ta_2O_5$, AlN, $Al_2O_3$ all have distinct and different structures. The amorphous mixture layers can be deposited on unheated substrates; on the same unheated substrate, the deposited electrodes are usually polycrystalline. The exemplary test cells described herein had a diameter in the range of about 100 micrometers.

A Pt-top electrode provides superior scratch resistance and thus convenient for laboratory electrical testing using a test probe, but other common electrodes can also be used. A Mo bottom electrode in provides a smooth sputtered interface thus convenient for subsequent mixture layer deposition, but other common electrodes can also be used. Common electrodes include but are not limited to Mo, W, Cu, Ta, TaN and TiN.

The bottom electrode was deposited by DC-sputtering. Film thickness, orientation and crystallinity were determined by a theta-2 theta diffractometer and a four circle x-ray diffractometer, both using a Cu Ka source. The surface morphology were observed by atomic force microscopy.

RF-sputtering was used to deposit the amorphous I-Pt (I=HfO$_2$, YO$_{3/2}$, MgO, TaO$_{5/2}$, AlN, AlO$_{3/2}$) layer and the top electrode, the latter through a shadow mask. Electrical properties were measured using several electrical meters on a Signatone S-1160 probe station. The mixture film was verified to be amorphous using a theta-2 theta diffractometer.

The above thin film devices show excellent resistance-switching between an initial low-resistance and a set high resistance, as shown by the current-voltage (I-V) and the resistance-voltage (R-V) curves in FIGS. 12-17. The on-off ratio of the resistance in the test devices typically exceeds 100:1. The device was tested repeatedly and showed little change in memory of either high or low resistance, as evidenced by the 50 overlapping R-V loops shown in FIG. 7.

Figure 12:
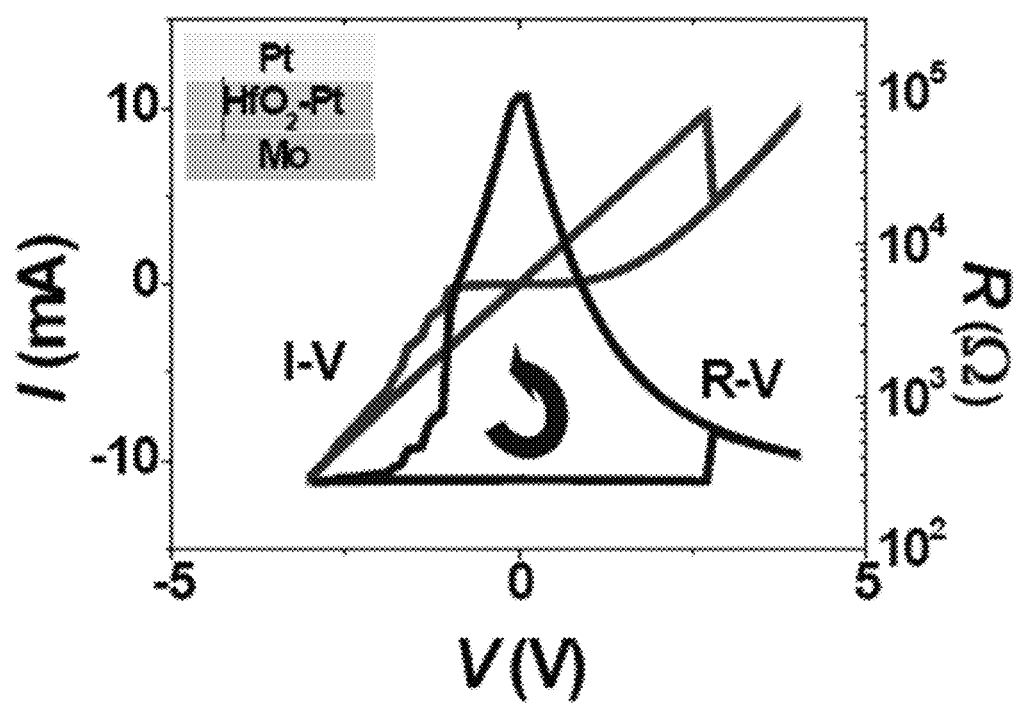
FIG. 12 shows exemplary I-V and R-V curves of one embodiment of the present invention using $HfO_2$—Pt, with the combination of Mo and Pt electrodes.
Figure 13:
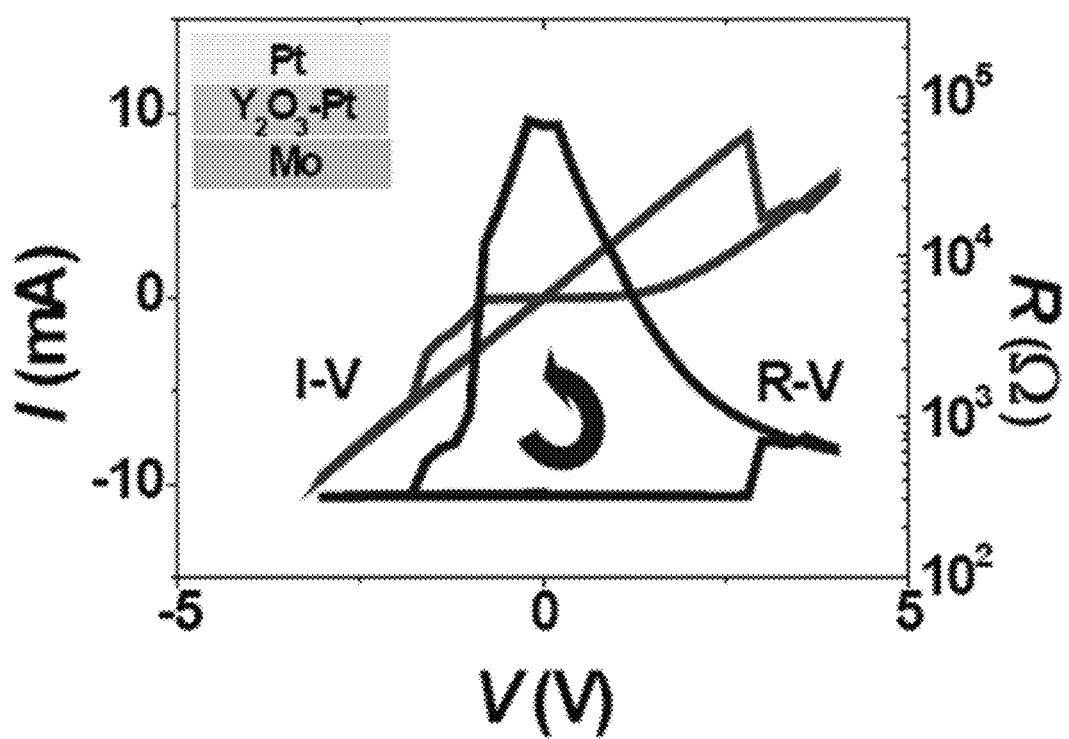
FIG. 13 shows exemplary I-V and R-V curves of one embodiment of the present invention using $YO_{3/2}$—Pt, with the combination of Mo and Pt electrodes.
Figure 14:
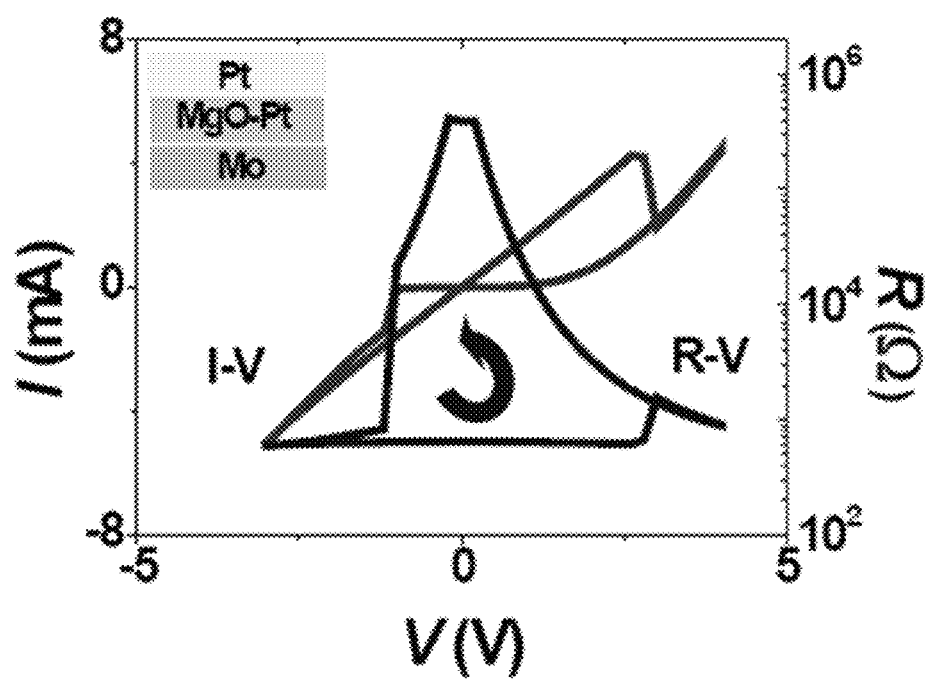
FIG. 14 shows exemplary I-V and R-V curves of one embodiment of the present invention using MgO—Pt, with the combination of Mo and Pt electrodes.
Figure 15:
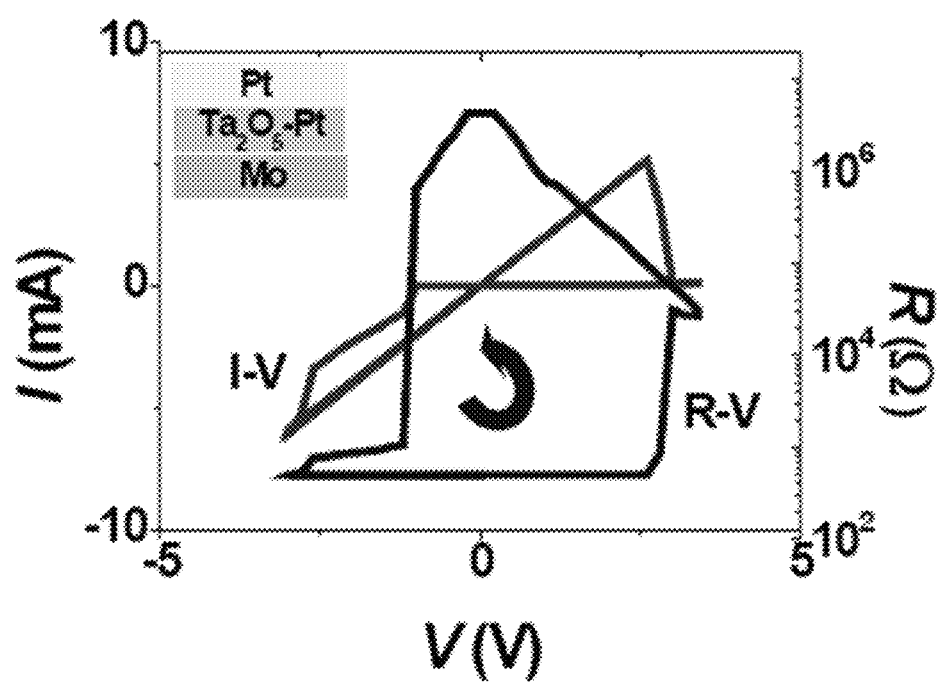
FIG. 15 shows exemplary I-V and R-V curves of one embodiment of the present invention using $TaO_{5/2}$—Pt, with the combination of Mo and Pt electrodes.
Figure 16:
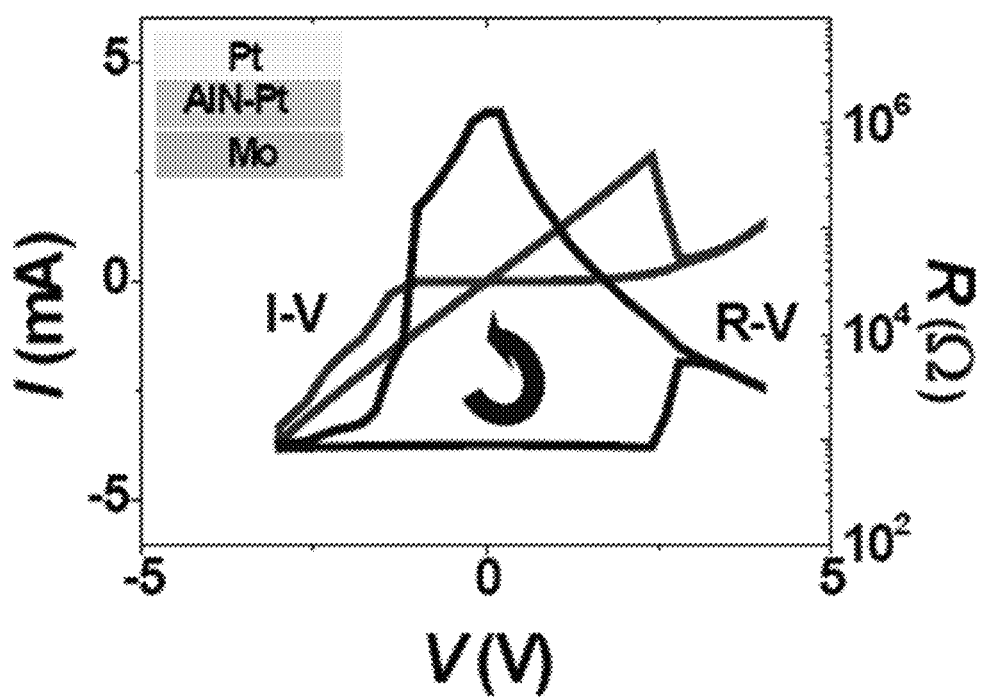
FIG. 16 shows exemplary I-V and R-V curves of one embodiment of the present invention using AlN—Pt, with the combination of Mo and Pt electrodes.
Figure 17:
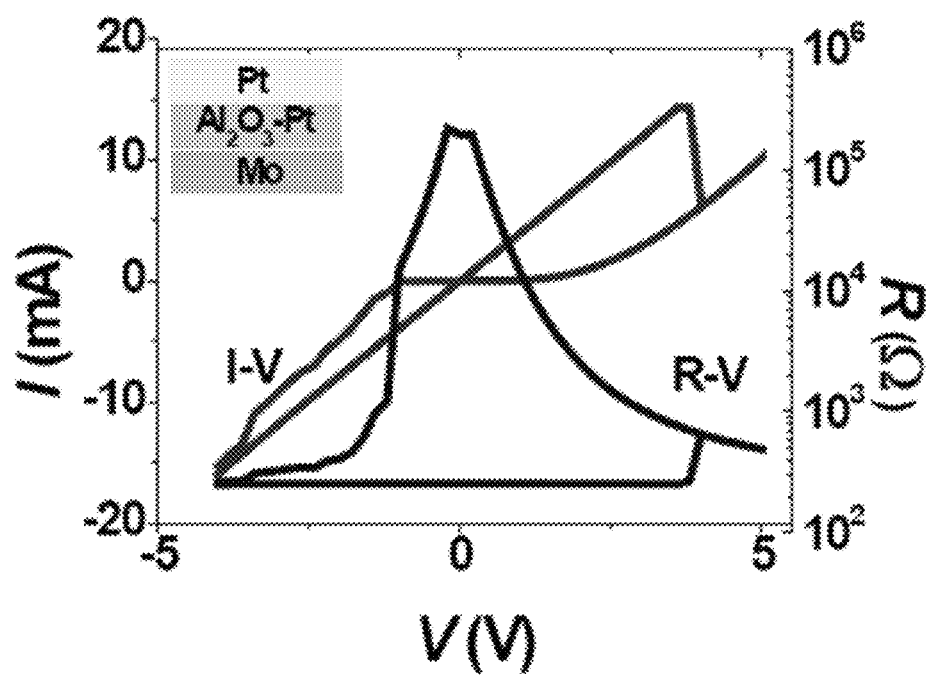
FIG. 17 shows exemplary I-V and R-V curves of one embodiment of the present invention using $AlO_{3/2}$—Pt, with the combination of Mo and Pt electrodes.
Figure 18:
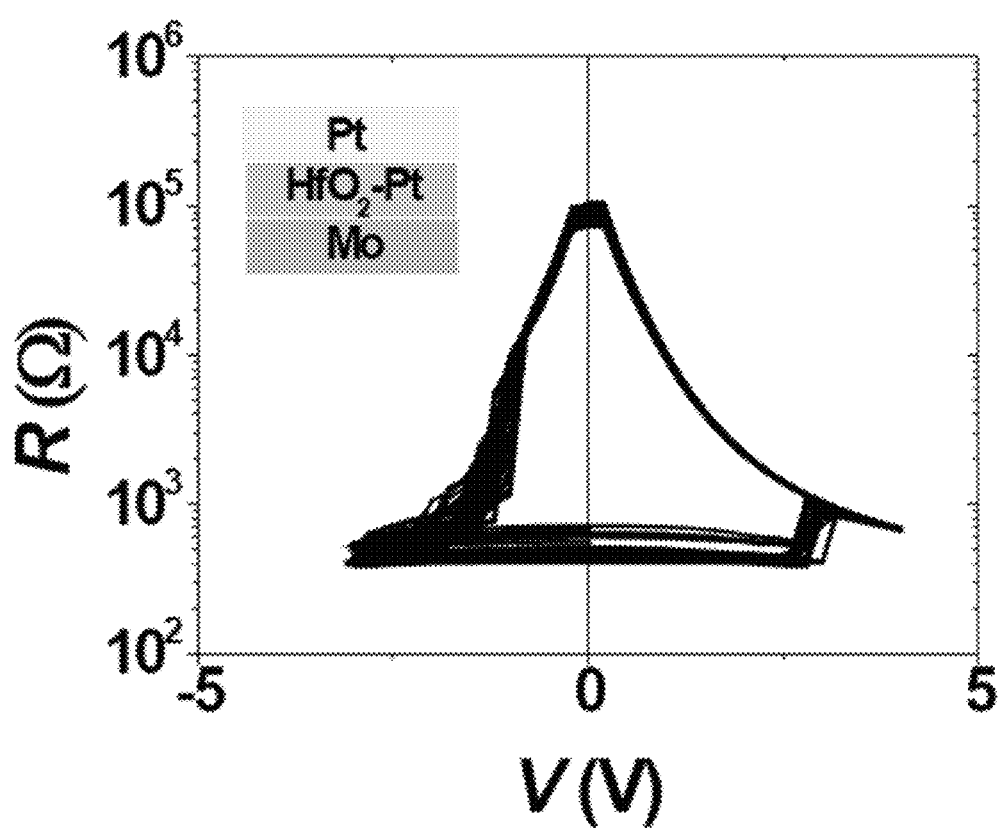
FIG. 18 shows 50 consecutive R-V curves of one embodiment of the present invention using $HfO_2$—Pt, with the combination of Mo and Pt electrodes.

Current-voltage (I-V) and resistance-voltage (R-V) curves were measured in both continuous and pulsed voltage-sweep modes. As used in the following tests, positive bias is the one causing a current to flow from the top electrode to the bottom electrode. A typical room temperature I-V and R-V curves of a device with an amorphous resistance-switching layer of I-Pt and Pt/Mo top/bottom electrodes as shown in FIG. 12 has a switching voltage of 3 V for low resistance to high resistance, and a switching voltage of −1 V for high resistance to low resistance.

The I-V and R-V curves were recorded in the voltage-control mode and were the same for both continuous and the pulsed mode. The resistance defined as the ratio of V/I is plotted along with a schematic circle indicating the rotational direction of the R-V hysteresis. The mixture shows a low initial resistance 280Ω and this low resistance state is stable under a negative bias. Under a positive bias, it is still stable below 3 V, but the resistance suddenly increases to a larger value, 600Ω when the bias exceeded 3 V. The high resistance state is non-linear with a resistance value that decreases with voltage. The high resistance state is kept at zero voltage indicating the memory is non-volatile: this zero-voltage resistance is typically higher than 20 kilo-ohm. The high resistance state is further kept until a negative bias of about −1.0 to −1.5 V is applied, which switches the resistance back to low resistance state. The device also allowed a read voltage between −0.5 V and +1 V without disturbing the high and low resistance states.

The voltage pulse required to switch the device was measured using repeated pulses of a certain pulse width, with the magnitude of their pulse voltage systematically increased until switching was complete. After each pulse, the resistance was measured at a fixed low voltage of about 0.2 V to determine whether switching had occurred or not. The process was next repeated using pulses of different widths.

The resistance states can be kept in a non-volatile manner as verified by certain retention experiments. The devices stored in air for several months experience no memory lapse. Generally, there is no need for an electrical source to maintain the resistance states.

Figure 19A:
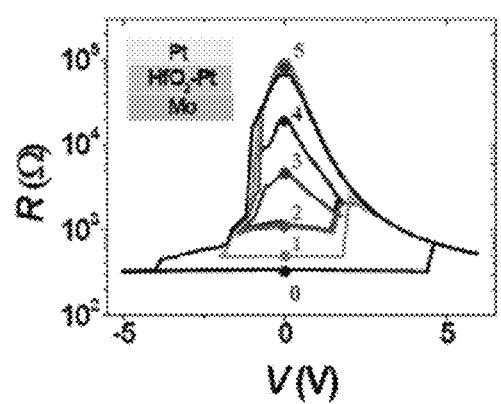
FIG. 19(a) shows multiple resistance states (0 to 5) achieved by varying voltage using $HfO_2$—Pt and FIG. 19(b) shows each state is stable and non-volatile for data storage.
Figure 19B:
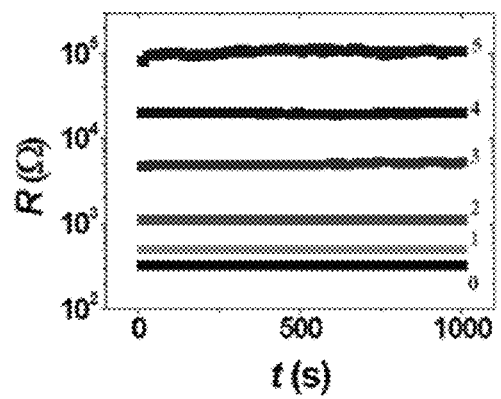

Switchable devices exhibit multilevel resistance states that are suitable for multi-bit data storage within a single cell. One example is shown in FIG. 19. Six distinct resistance states achieved by varying the stress voltage are labeled as "0", "1", "2", "3", "4" and "5" in FIG. 19(*a*). Each state is stable and non-volatile, in the sense that their resistance values are kept without the need of applying any voltage to maintain them, as shown in FIG. 19(*b*). Such multi-bit cells can increase the storage density of nonvolatile memory.

Figure 20:
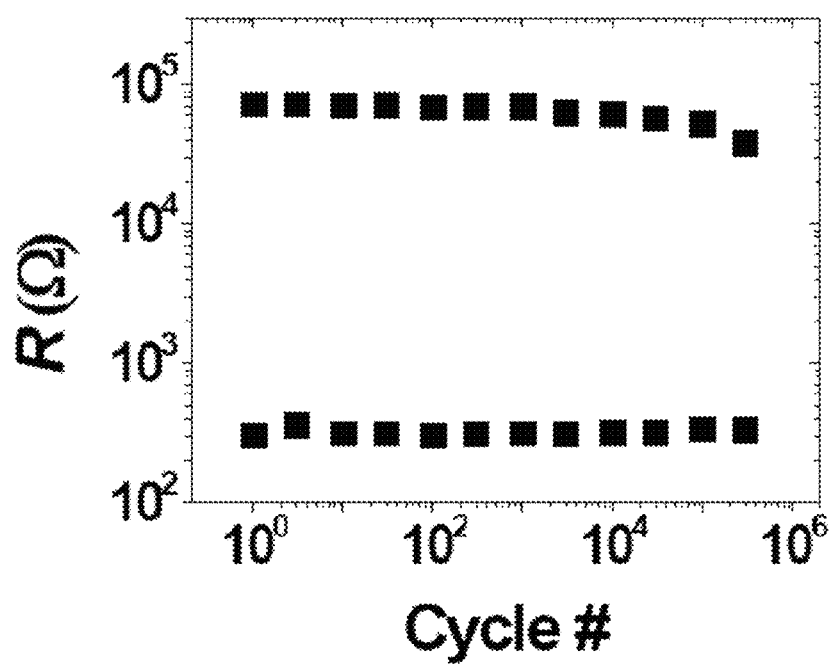
FIG. 20 shows a cycling test with 10 μs pulses (+7 V, −6 V). Resistance check was made using 0.2 V read voltage. No noticeable degradation after $4 \times 10^5$ cycles.

Switchable devices can be switched repeatedly using a pulse. FIG. 20 shows a cycling test with 10 µs pulses (+7 V, −6 V). Periodic resistance check was made using 0.2 V read voltage. There is no noticeable degradation after 4×10$^5$ cycles.

Such switchable devices were fabricated using a range of metal composition (f$_{Pt}$) and mixture layer thickness. One example is shown in FIG. 21 for exemplary devices made of amorphous MgO—Pt mixture layer.

Figure 21:
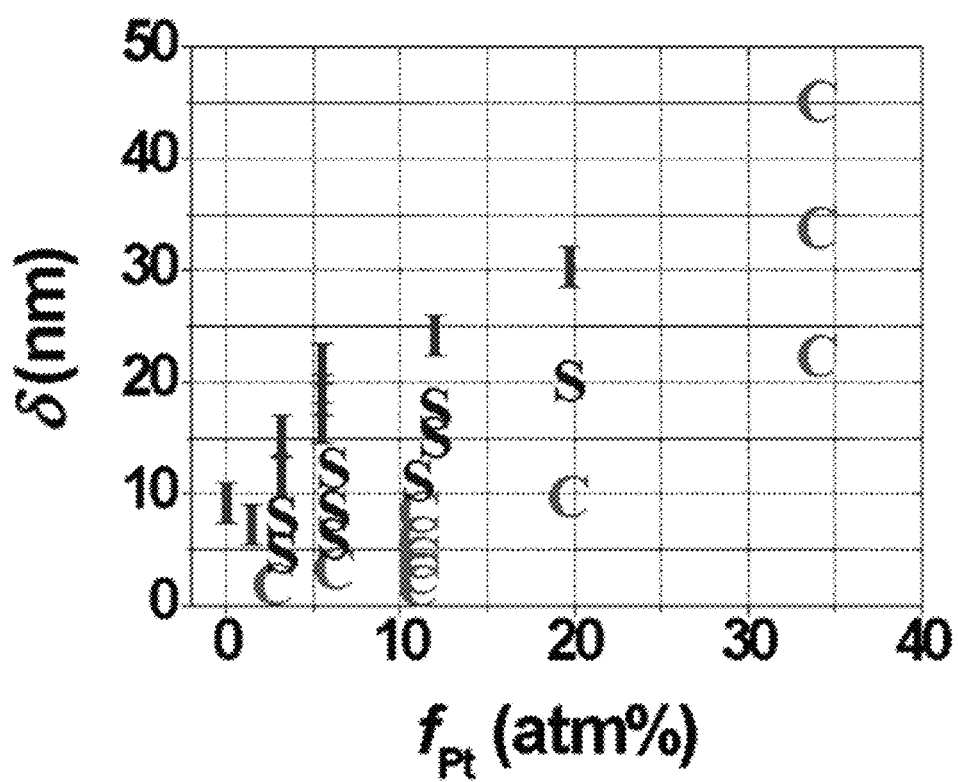
FIG. 21 depicts exemplary thickness-metal composition combinations for a switching device using an amorphous MgO—Pt mixture layer.

In FIG. 21, S labels signify for switchable film devices, C labels signify for conducting film devices with consistently low resistance, and I labels signify insulating film devices with consistently high resistance. Both C and I devices do not show resistance switching. Here, the metal composition in atomic % follows the definition of 100×(mole of Pt/[mole of Pt+mole of AO$_x$N$_y$]), where AO$_x$N$_y$ is the insulator I and Pt is the electrical conducting composition in the amorphous mixture film. Without being bound to any particular theory, switching behavior is attained at certain film thicknesses that are between the thicknesses that yield conducting and insulating structures.

It should be understood that the results shown in FIG. 21 are not limiting and that the disclosed techniques may be extended to other metal or electrical conducting compositions used in place of (or with) Pt.

Figure 22:
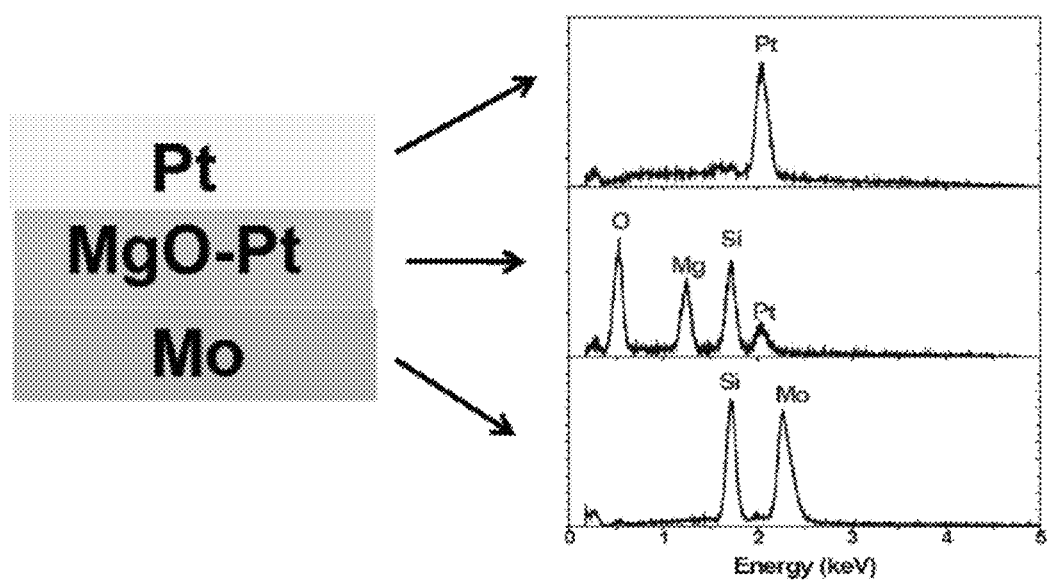
FIG. 22 depicts the energy dispersive X-ray spectroscopy (EDX) of each layer in a device stack of Mo/MgO—PVPt.
Figure 23:
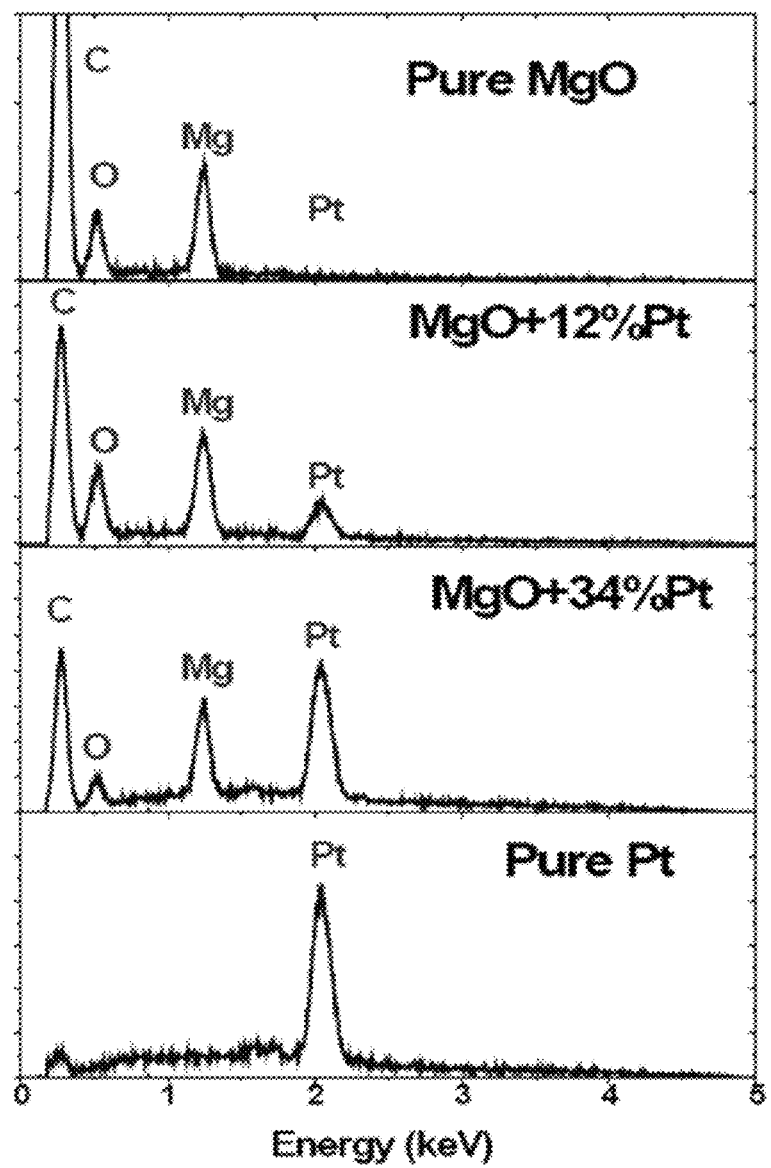
FIG. 23 depicts the energy dispersive X-ray spectroscopy (EDX) of pure MgO, MgO—Pt of two compositions, and pure Pt films. The C signal comes from the graphite substrate onto which the films were deposited.

The composition described above was determined using energy dispersive X-ray spectroscopy. As shown in FIG. 22, the analysis confirms the three distinct layers in a device stack: a Pt top electrode, an intermediate, mixed layer containing Pt, Mg and O, and a Mo bottom electrode. (In FIG. 22, the Si peak is due to the stray signal from the Si substrate.) Another example of comparing mixture layers with different Pt compositions and a pure MgO film as well as a pure Pt film is shown in FIG. 23. Here, the above three layers were separately deposited onto graphite substrates, which substrate provided the C peaks in the figure.

What is claimed:
1. A resistive device, comprising:
at least one amorphous layer that comprises:
a composition comprising:
an electrically insulating composition that comprises N and both Al and Si;
an electrically conducting composition that comprises
(a) a metal M, wherein M comprises Pt, Pd, Ni, W, Au, Ag, Cu, Al, Rh, Re, Ir, Os, Ru, Nb, Ti, Zr, Hf, V, Ta, Cr, Mo, Mn, Tc, Fe, Co, Zn, Ga, In, Cd, Hg, Tl, Sn, Pb, Sb, Bi, Be, Mg, Ca, Sr, Ba, Li, Na, K, Rb, Cs,
(b) a conducting metal (Me) nitride, MeN$_x$, wherein x is in the range of from about 0.5 to about 3,
or any combination of (a) and (b), and
wherein the electrically conducting composition comprises from about 1 percent to about 40 percent by molar percentage of the amorphous layer, wherein the molar percentage of the electrically conducting composition is defined as (% M+% Me)/(% Al+% Si+% M+% Me)×100, according to the M and Me present in the electrically conducting composition and Al and Si present in the electrically insulating composition; and
at least two electrodes in electrical contact with one another via the amorphous layer.

2. The resistive device of claim 1, wherein the electrically insulating composition comprises an oxynitride of Al and an oxynitride of Si.

3. The resistive device of claim 2, wherein the electrically insulating composition comprises one or more of Si$_{3-x}$Al$_x$N$_{4-x}$O$_x$, termed SiAlON, wherein 3>x>0.

4. The resistive device of claim 2, wherein the electrically insulating composition comprises doped (Si,Al)(O,N).

5. The resistive device of claim 1, wherein the electrically conducting composition comprises from about 1 percent to about 35 percent by molar percentage of the amorphous layer.

6. The resistive device of claim 1, wherein the distance between the at least two electrodes is from about 2 to about 60 nm.

7. A method for switching a resistive device, comprising:
to the resistive device comprising:
at least one amorphous layer that comprises:
a composition comprising:
an electrically insulating composition that comprises N and both Al and Si;
an electrically conducting composition that comprises
(a) a metal M, wherein M comprises Pt, Pd, Ni, W, Au, Ag, Cu, Al, Rh, Re, Ir, Os, Ru, Nb, Ti, Zr, Hf, V, Ta, Cr, Mo, Mn, Tc, Fe, Co, Zn, Ga, In, Cd, Hg, Tl, Sn, Pb, Sb, Bi, Be, Mg, Ca, Sr, Ba, Li, Na, K, Rb, Cs,
(b) a conducting metal (Me) nitride, $MeN_x$, wherein x is in the range of from about 0.5 to about 3,
or any combination of (a) and (b), and
wherein the electrically conducting composition comprises from about 1 percent to about 40 percent by molar percentage of the amorphous layer, wherein the molar percentage of the electrically conducting composition is defined as (% M+% Me)/(% Al+% Si+% M+% Me)×100, according to the M and Me present in the electrically conducting composition and Al and Si present in the electrically insulating composition; and
at least two electrodes in electrical contact with one another via the amorphous layer,
providing a first current or voltage via the electrodes to the amorphous layer so as to change a resistance state of the resistive device.

* * * * *